United States Patent
Spencer et al.

(10) Patent No.: US 10,132,119 B2
(45) Date of Patent: Nov. 20, 2018

(54) DIRECTIONAL DRILL AHEAD SIMULATOR: DIRECTIONAL WELLBORE PREDICTION USING BHA AND BIT MODELS

(71) Applicants: Reed W. Spencer, Spring, TX (US); Jonathan M. Hanson, Salt Lake City, UT (US)

(72) Inventors: Reed W. Spencer, Spring, TX (US); Jonathan M. Hanson, Salt Lake City, UT (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 687 days.

(21) Appl. No.: 14/517,433

(22) Filed: Oct. 17, 2014

(65) Prior Publication Data

US 2015/0142406 A1 May 21, 2015

Related U.S. Application Data

(60) Provisional application No. 61/892,959, filed on Oct. 18, 2013.

(51) Int. Cl.
*E21B 7/04* (2006.01)
*G06F 17/50* (2006.01)

(52) U.S. Cl.
CPC ............ *E21B 7/04* (2013.01); *G06F 17/5009* (2013.01)

(58) Field of Classification Search
CPC .............................. E21B 7/04; G06F 17/5009
USPC .......................................................... 703/10
See application file for complete search history.

(56) References Cited

U.S. PATENT DOCUMENTS

| 4,794,534 A * | 12/1988 | Millheim ............... E21B 44/00 175/40 |
| 4,804,051 A | 2/1989 | Ho |
| 6,438,495 B1 | 8/2002 | Chau et al. |
| 7,027,925 B2 | 4/2006 | Terentyev |
| 7,555,414 B2 * | 6/2009 | Calhoun ............... E21B 49/006 702/11 |

(Continued)

OTHER PUBLICATIONS

Overburden Pressure Defined Archived Wikipedia dated Feb. 28, 2013 downloaded from https://en.wikipedia.org/w/index.php?title=Overburden_pressure&oldid=541204319.*

(Continued)

*Primary Examiner* — Brian S Cook
(74) *Attorney, Agent, or Firm* — Cantor Colburn LLP

(57) ABSTRACT

A method for predicting a path of a borehole that will be drilled in a rock formation by a bottomhole assembly (BHA) having a drill bit includes: constructing a model of the BHA; calculating confined compressive strength of the rock formation using an axial motion drill bit model that receives drilling parameter, drill bit design and lithology information; calculating lateral motion of the drill bit using a lateral motion drill bit model; calculating a ratio of lateral motion to axial motion using the lateral motion drill bit model; calculating an inclination angle and an azimuthal direction of the BHA using a BHA steering model that receives the ratio; and iterating the above steps by updating the BHA model to include extending the borehole an incremental distance in the direction of the inclination angle and the azimuthal direction and displacing the BHA the incremental distance in the extended borehole.

17 Claims, 38 Drawing Sheets

(56) References Cited

U.S. PATENT DOCUMENTS

| | | | |
|---|---|---|---|
| 7,693,695 | B2 | 4/2010 | Huang et al. |
| 7,729,895 | B2 | 6/2010 | Chen |
| 7,778,777 | B2 | 8/2010 | Chen |
| 7,827,014 | B2 | 11/2010 | Chen |
| 7,831,419 | B2 * | 11/2010 | Cariveau ............... E21B 10/00 175/336 |
| 8,145,465 | B2 | 3/2012 | Chen |
| 8,185,365 | B2 | 5/2012 | Centala et al. |
| 2006/0167668 | A1 | 7/2006 | Cariveau et al. |
| 2006/0180356 | A1 | 8/2006 | Durairajan et al. |
| 2007/0029113 | A1 | 2/2007 | Chen |
| 2008/0078242 | A1 * | 4/2008 | Hassan ................ E21B 47/08 73/152.29 |
| 2009/0090555 | A1 * | 4/2009 | Boone ................ E21B 44/02 175/45 |
| 2010/0324825 | A1 | 12/2010 | Detournay et al. |
| 2011/0214878 | A1 * | 9/2011 | Bailey ................ E21B 7/00 166/369 |
| 2013/0144531 | A1 * | 6/2013 | Johnston ............ E21B 44/00 702/9 |
| 2015/0142403 | A1 | 5/2015 | Spencer et al. |
| 2015/0142404 | A1 | 5/2015 | Spencer et al. |
| 2015/0363523 | A1 | 12/2015 | Chen |

OTHER PUBLICATIONS

Calhoun_2005 (New Confined Compressive Strength Calculation Improves Bit Selection and Bit Performance, AADC-05-NTCE-61 Houston, Texas, Apr. 5-7, 2005).*

Onyia_1987 (Geology Drilling Log—A Computer Database System for Drilling Simulation, SPE Drilling Engineering, Mar. 1987).*

Aghassi_2003 (Investigation of Qualitative Method for Diagnosis of Poor Bit Performance Using Surface Drilling Parameters, Lousiana State University, Thesis 2003.).*

Brett_1986 (A Method of Modeling the Directional Behavior of Bottomhole Assemblies Including Those with Bent Subs and Downhole Motors, IADC/SPE 14767, 1986 Drilling Conference).*

Azizov et al., "Optimized Steerable Motor Design Overcomes Drilling Challenges in the Fayetteville Shale Unconventional Play", SPE151135, SPE Middle East Unconventional Gas Conference and Exhibition, Abu Dhabi, UAE, Jan. 23-25, 2012, 20 pages.

Brett et al., "A Method of Modeling the Directional Behavior ofBottomhole Assemblies Including Those With Bent Subs and Downhole Motors", IADC/SPE 14767, 1986 IADC/SPE DrillingConference, Dallas, TX, Feb. 10-12, 1986, 12 pages.

Dahl et al, "A New Bottomhole Assembly Analysis Program for the Prediction of the Borehole Path Based on a Sophisticated Static Algorithm", SPE/IADC 21948, 1991 SPE/IADC Drilling Conference, Amsterdam, Mar. 11-14, 1991, 12 pages.

Downton, G. C, "Directional Drilling System Response and Stability", 16th IEEE International Conference on Control Applications Part of IEEE Multi-conference on Systems and Control Singapore, Oct. 1-3, 2007, 8 pages.

Grimes et al., "Advances in Steel Tooth Technology Pushing PDC Out of GoM Applications", AADE-07-NTCE-09, 2007 AADE National Technical Conference and Exhibition, Houston, TX, Apr. 10-12, 2007, 16 pages.

Hanson, Jonathon, "A Fortran DLL that encapsulates the functionality of PDC Wear and PDC Gopher" Hughes Christensen Company, Mar. 18, 2013, 22 pages.

Rafie, S., "Mechanistic Approach in Designing BHA'S;and Forecasting Wellbore Position", IADC/SPE 17196, 1988 IADC/SPE Drilling Conference, Dallas, TX Feb. 28-Mar. 2, 1988, 10 pages.

* cited by examiner

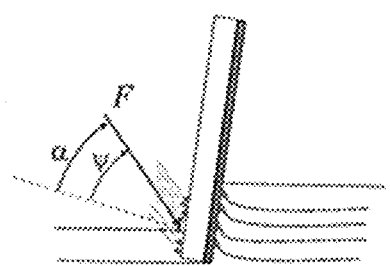
FIG. 26 A
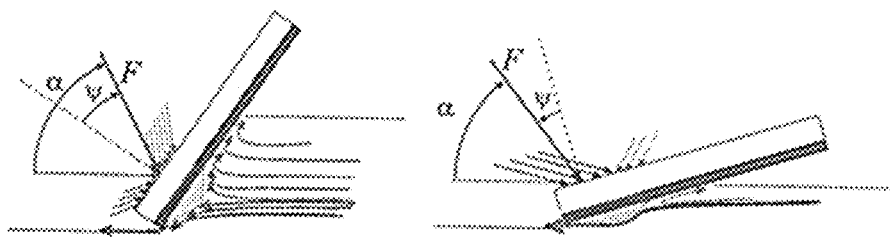
FIG. 26 B     FIG. 26C

DIRECTIONAL DRILL AHEAD SIMULATOR: DIRECTIONAL WELLBORE PREDICTION USING BHA AND BIT MODELS

CROSS-REFERENCE TO RELATED APPLICATION

This application claims the benefit of an earlier filing date from U.S. Provisional Application Ser. No. 61/892,959 filed Oct. 18, 2013 the entire disclosure of which is incorporated herein by reference.

BACKGROUND

Geologic formations are used for many applications such as hydrocarbon production, geothermal production, and carbon dioxide sequestration. Typically, boreholes are drilled into the formations to provide access to them. Drilling rigs disposed at the surface, whether it is land or water, operate drill strings that are connected to drill bits for drilling the boreholes. In that it is very expensive to operate a drilling rig, efficiencies can be achieved by precisely drilling a borehole to achieve a desired geometry and end location. Hence, it would be well received in the drilling and geophysical exploration industries if method and apparatus would be developed to predict a borehole geometry and end location based on drill rig operating parameters.

BRIEF SUMMARY

Disclosed is a method for predicting a path of a borehole that will be drilled in a rock formation by a bottomhole assembly (BHA) comprising a drill bit coupled to a drill tubular, the BHA being operated by a drill rig. The method includes: constructing a BHA model of the BHA, the BHA model having (a) dimensions, geometry, mass distribution, material density, and material stiffness of the BHA and (b) dimensions and geometry of the borehole as predicted to be drilled, the BHA model being configured to calculate (c) one or more points of contact between the BHA and a wall of the borehole and (d) forces imposed on the BHA at the one or more contact points, the forces comprising a side force vector imposed on the drill bit, and (e) drill bit tilt; calculating confined compressive strength of the rock formation using an axial motion drill bit model that receives drilling parameters for the drill rig, drill bit design information, and lithology information comprising formation rock strength; calculating lateral motion of the drill bit using a lateral motion drill bit model that receives (i) the calculated confined compressive strength, (ii) the lithology information, (iii) the drill bit design information, and (iv) the drill bit side force vector and drill bit tilt from the BHA model; calculating a ratio of lateral motion to axial motion using the lateral motion drill bit model; calculating an inclination angle and an azimuthal direction of the BHA using a BHA steering model that receives the ratio; and iterating the above steps by updating the BHA model to include extending the borehole an incremental distance in the direction of the inclination angle and the azimuthal direction and displacing the BHA the incremental distance in the extended borehole; wherein the method is implemented by a processor.

Further disclosed is a non-transitory computer-readable medium having computer-executable instructions for predicting a path of a borehole that will be drilled in an earth formation by a bottomhole assembly (BHA) having a drill bit coupled to a drill tubular, the BHA being operated by a drill rig, by implementing the following steps. The steps include: constructing a BHA model of the BHA, the BHA model having (a) dimensions, geometry, mass distribution, material density, and material stiffness of the BHA and (b) dimensions and geometry of the borehole as predicted to be drilled, the BHA model being configured to calculate (c) one or more points of contact between the BHA and a wall of the borehole and (d) forces imposed on the BHA at the one or more contact points, the forces comprising a side force vector imposed on the drill bit, and (e) drill bit tilt; calculating confined compressive strength of the rock formation using an axial motion drill bit model that receives drilling parameters for the drill rig, drill bit design information, and lithology information including formation rock strength; calculating lateral motion of the drill bit using a lateral motion drill bit model that receives (i) the calculated confined compressive strength, (ii) the lithology information, (iii) the drill bit design information, and (iv) the drill bit side force vector and drill bit tilt from the BHA model; calculating a ratio of lateral motion to axial motion; calculating an inclination angle and an azimuthal direction of the BHA using a BHA steering model that receives the ratio; and iterating the above steps by updating the BHA model to include extending the borehole an incremental distance in the direction of the inclination angle azimuthal direction and displacing the BHA the incremental distance in the extended borehole.

BRIEF DESCRIPTION OF THE DRAWINGS

The following descriptions should not be considered limiting in any way. With reference to the accompanying drawings, like elements are numbered alike:

FIGS. 5A-5B, collectively known as FIG. 5, illustrates a more detailed process flow chart for the method for predicting inclination of a borehole being drilled;

FIGS. 26A-26C, collectively referred to as FIG. 26, depict aspects of various back rake angle of a cutter;

DETAILED DESCRIPTION

A detailed description of one or more embodiments of the disclosed apparatus and method presented herein by way of exemplification and not limitation with reference to the figures.

Disclosed is a drill ahead method for predicting or simulating a geometry of a borehole that will be drilled or is being drilled based on operating parameters that may be applied to a drill string by a drill rig. In this manner, the operating parameters can be selected so that the actual borehole has a desired geometry such as trajectory or path, bend radius, and final end location. Apparatus such as software programming that implement this method may be referred to as a directional drill ahead simulator. The drill ahead method uses a drill string steering model to predict an inclination of the drill bit and thus the borehole at the point it is being drilled. Dynamics of the drill bit are modeled using an axial motion drill bit model, referred to as DRILLBIT, and a lateral motion drill bit model referred to as SIDECUT. Formation lithology and drill rig operating parameters, such as weight-on-bit, rate-of-penetration, or drill string torque are input into DRILLBIT and/or SIDECUT in order to precisely estimate the motion of the drill bit based on calculated interaction of the drill bit and the formation rock.

Figure 1:
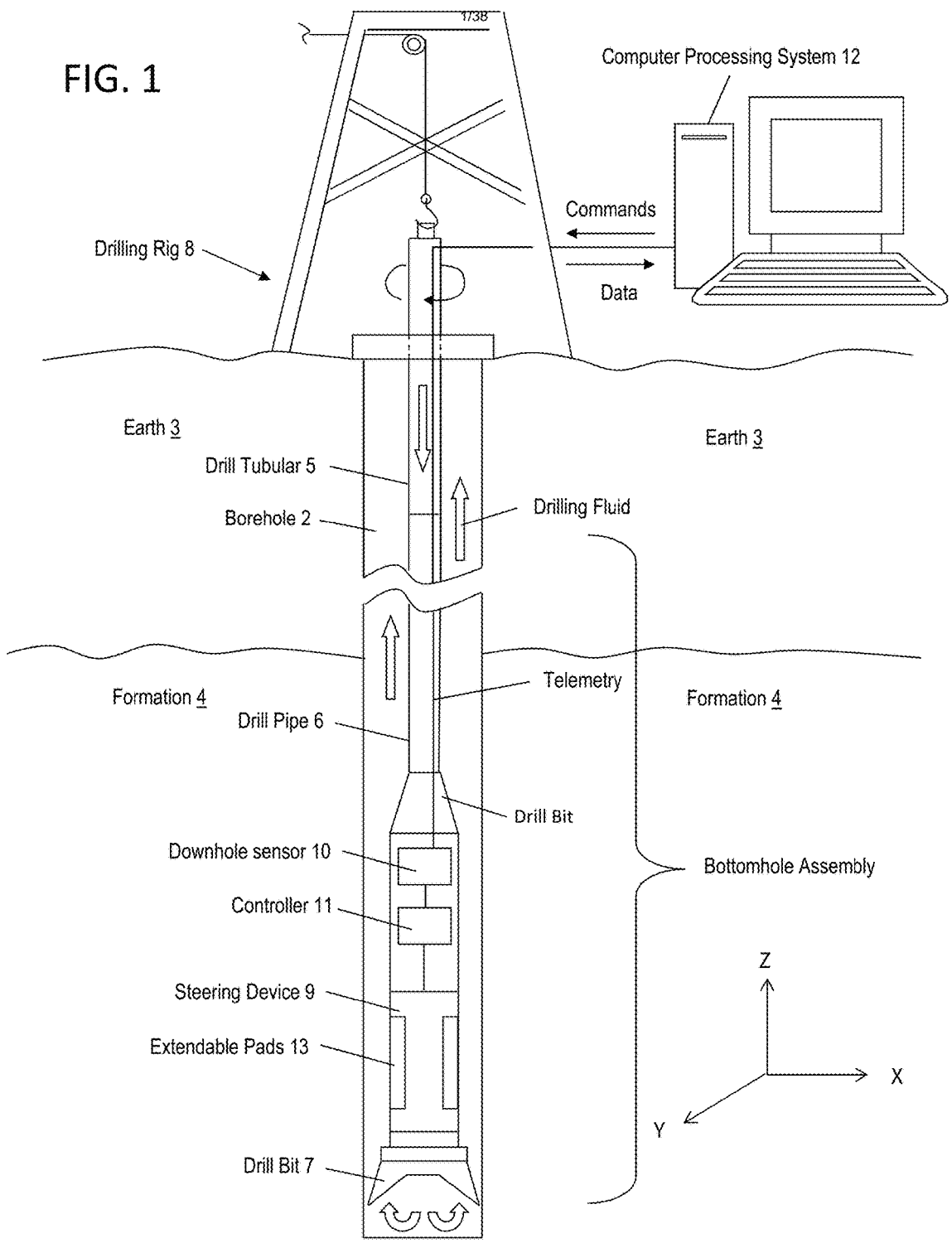
FIG. 1 illustrates a cross-sectional view of an exemplary embodiment of a drill string and drill bit disposed in a borehole penetrating the earth.

Next, apparatus for drilling a borehole is discussed. FIG. 1 illustrates a cross-sectional view of an exemplary embodiment of a drill tubular 5 disposed in a borehole 2 penetrating the earth 3, which may include an earth formation 4. The formation 4 represents any subsurface material of interest that may be drilled by the drill tubular 5. In the embodiment of FIG. 1, the drill tubular 5 is a drill string made of drill pipes 6 serially coupled together. A drill bit 7 is disposed at the distal end of the drill tubular 5. The drill string together with the drill bit may be referred to as a bottomhole assembly (BHA). A drill rig 8 is configured to conduct drilling operations such as rotating the drill tubular 5 and thus the drill bit 7 in order to drill the borehole 2. In addition, the drill rig 8 is configured to pump drilling fluid (sometimes referred to as drilling mud) through the drill tubular 5 in order to lubricate the drill bit 7 and flush cuttings from the borehole 2. A mud motor (not shown) may be included in the BHA. The mud motor is configured to convert energy from the drilling fluid into additional rotational energy for rotating the drill bit. A steering device 9 is coupled to the drill tubular 5 and is configured to steer the drilling of the borehole 2 in a desired or intended direction using extendable pads 13 for example. Other steering configurations may also be used such as one that bends the BHA. The intended direction may include an inclination direction (i.e., up or down with respect to the earth's surface) and/or an azimuthal direction (i.e., with respect a reference azimuth such as true or grid north). It can be appreciated that in one or more embodiments the steering device 9 is disposed close to the drill bit 7, within three feet for example, so that the force or portion of the force being applied to the drill tubular 5 by the steering device 9 is also being applied to the drill bit 7. The steering device 9 in one or more embodiments may be considered as part of the BHA. A controller 11 is configured to control the steering device 9 to steer the drilling of the borehole in the desired direction. The controller 11, which may include downhole electronics, may also act as an interface with telemetry to communicate data or commands between downhole components and a computer processing system 12 disposed at the surface of the earth 3. Non-limiting embodiments of the telemetry include pulsed-mud and wired drill pipe. System operation, control and/or data processing operations may be performed by the controller 11, the computer processing system 12, or a combination thereof. The BHA may include a sensor 10 configured to sense various downhole parameters, which may be transmitted uphole to the computer processing system 12 for data recording, processing or display to an operator or analyst. Examples of downhole parameters include BHA inclination, BHA acceleration, and formation parameters that may be logged such as mineralogy. The teachings disclosed herein may be implemented in real time by the computer processing system that receives sensor data or the teachings may be implemented by another computer processing system that does not receive sensor data in real time.

Figure 2:
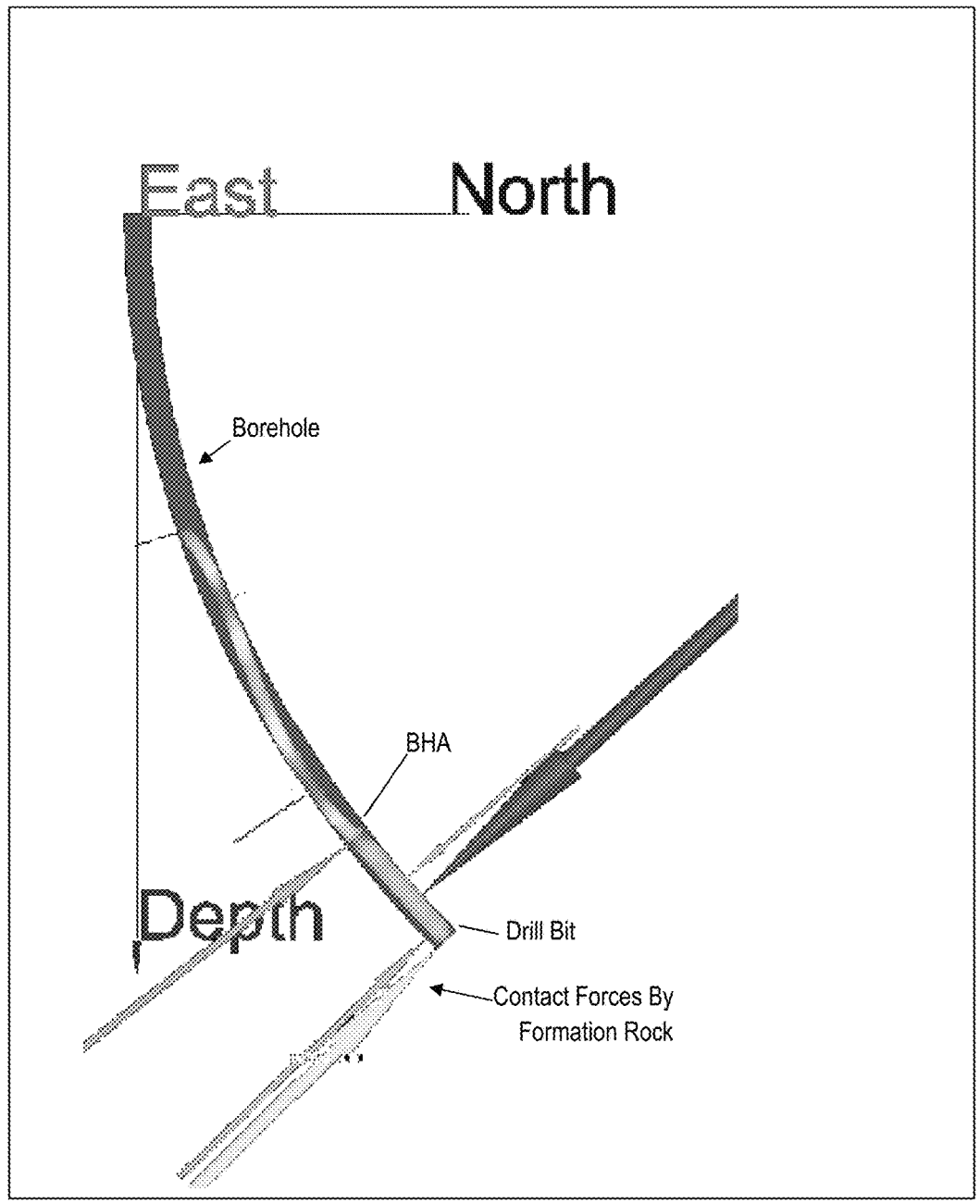
FIG. 2 depicts aspects of output from a bottomhole assembly (BHA) model.

Next, certain definitions are presented for convenience. The term "BHA model" relates to a finite element model or beam model that models the dynamics of the BHA (i.e., drill string and drill bit) in a borehole. In it, the user can create a hole geometry by specifying the length of a hole section and the inclinations at each end of the hole section. Each section may be represented by a series of circles where each circle represents a cross-section of the borehole. The model automatically represents sections of the BHA between the two ends of the hole section that the user has specified. Once a hole is created, a drillstring or BHA can be created and put in the hole. The finite element model or beam model computes how the drillstring lays in the hole, where it contacts the hole, how the drillstring is curved or flexed and magnitude and direction of the contact forces where it touches the borehole wall based on the operating parameters applied to the BHA by the drill rig. The BHA model can also calculate the bit tilt of the drill bit, which is the angle between the longitudinal axis of the drill bit and the longitudinal axis of the borehole or the difference between the inclination of the drill bit and the inclination of the borehole. One example of a BHA model is BHASYS Pro by Baker Hughes. FIG. 2 illustrates an example of output provided by the BHA model, which illustrates the direction and magnitude of the contact forces and the geometry of the BHA. In that BHA models are known those in the art, further details of these models are not discussed in further detail.

Figure 3:
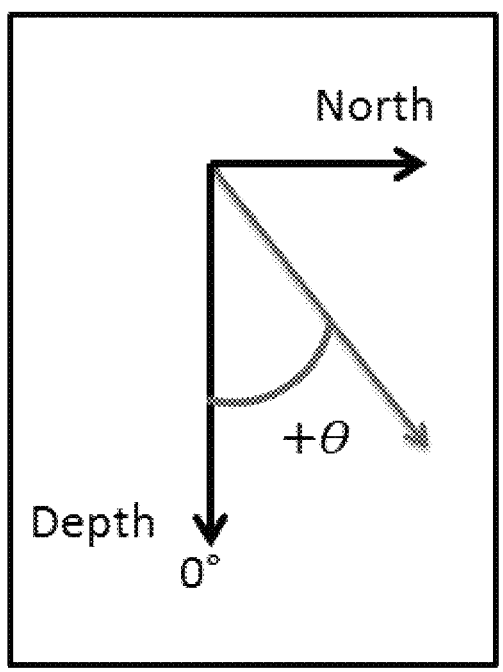
FIG. 3 illustrates inclination measurement convention.

The essential conventions and coordinate systems used in this disclosure are the definition of inclination, build-up-rate (BUR), and Dog Leg Severity (DLS). Inclination $\theta$ is measured from the vertical depth axis as illustrated in FIG. 3. BUR is measured as change in inclination with respect to measured depth. In other words, it is the hole curvature projected onto a vertical plane. Dog Leg Severity (DLS) is the change in hole angle with respect to measured depth. It is simply the curvature of the hole, regardless of how the hole is oriented. It could be curving to the side, or curving upward, etc. The inclination will be denoted with the symbol $\theta$. The subscript "new" used with $\theta_{new}$ refers to the inclination at the very end (bottom of the hole) of the survey section that is being created by the predictive BUR algorithm. $\theta_{old}$ refers to the survey section at the top of the newly created survey section. It is called "old" because in BHASYS Pro, the inclinations where survey sections join are always equal to one another. Thus, the inclination at the bottom of the hole for survey section N will be equal to the inclination at the top of the survey section for survey section N+1.

Figure 4:
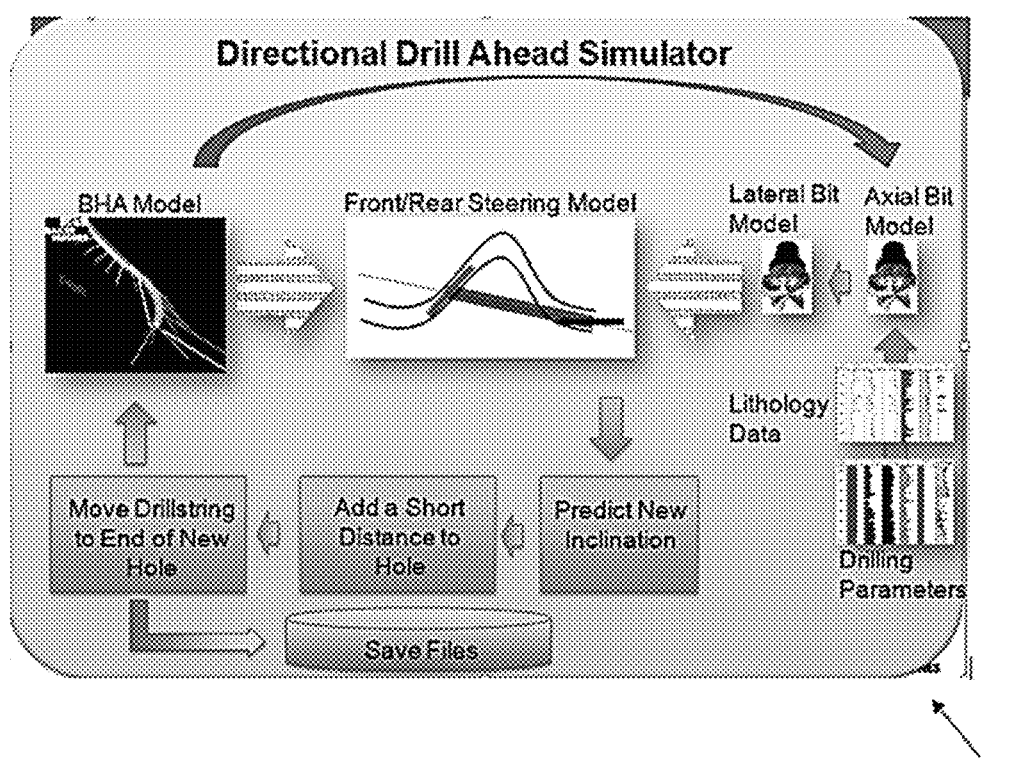
FIG. 4 illustrates a process flow chart for a method for predicting inclination of a borehole being drilled.

Next, a directional drill ahead simulation method 40 for adding a new section of borehole to the BHA model is discussed. Aspects of the method 40 are depicted in FIG. 4. First, The BHA model is run. The BHA model gives its forces, bit tilt, moments, and curvature information to the axial and lateral motion drill bit models. It also gives hole curvature and BHA alignment within the hole to the steering model. Next, the axial motion drill bit model runs using input from formation lithology logs and drill rig operating parameters. It calculates a rock strength (e.g., confined compressive strength) and a rate-of-penetration (ROP). Then, the ROP and rock strength are given to the lateral motion drill bit model. The lateral motion drill bit model uses this data and the data such as bit side force and bit tilt, which was supplied by the BHA model, to calculate the ratio of lateral ROP to axial ROP or lateral displacement to axial displacement for the drill bit for a certain time period. This is called dL/dZ. A front steering angle, $\delta\_front$, of the BHA is derived from dL/dZ and is defined as:

$$\delta_{front} = \tan^{-1}\left(\frac{dL}{dZ}\right).$$

Using the small angle approximation, an alternate definition is:

$$\delta_{front} = \left(\frac{dL}{dZ}\right).$$

The steering model is next invoked (explained in detail below). The steering model calculates inclination and azimuth for the end of a new hole section to be created by simulated drilling using $\delta_{front}$. A new hole section is created based on the calculated inclination and azimuth. The BHA and bit are moved down to the bottom of the new hole section and the three models (BHA, axial motion drill bit model and lateral motion drill bit model) are invoked again. Thus, the cycle continues until the simulation is stopped. The drill ahead simulation method runs the BHA model first, then feeds its results to the axial and lateral drill bit models which are incorporated into the drill ahead simulation method. The drill ahead simulation method then predicts the location and geometry of the next hole section.

There are alternate ways or sequences of running the models, but the main point is that the steering model is fed information by the other models, and a new simulated hole section is placed in the direction that the bit/BHA system wants to drill as calculated by the steering model.

Figure 5B:
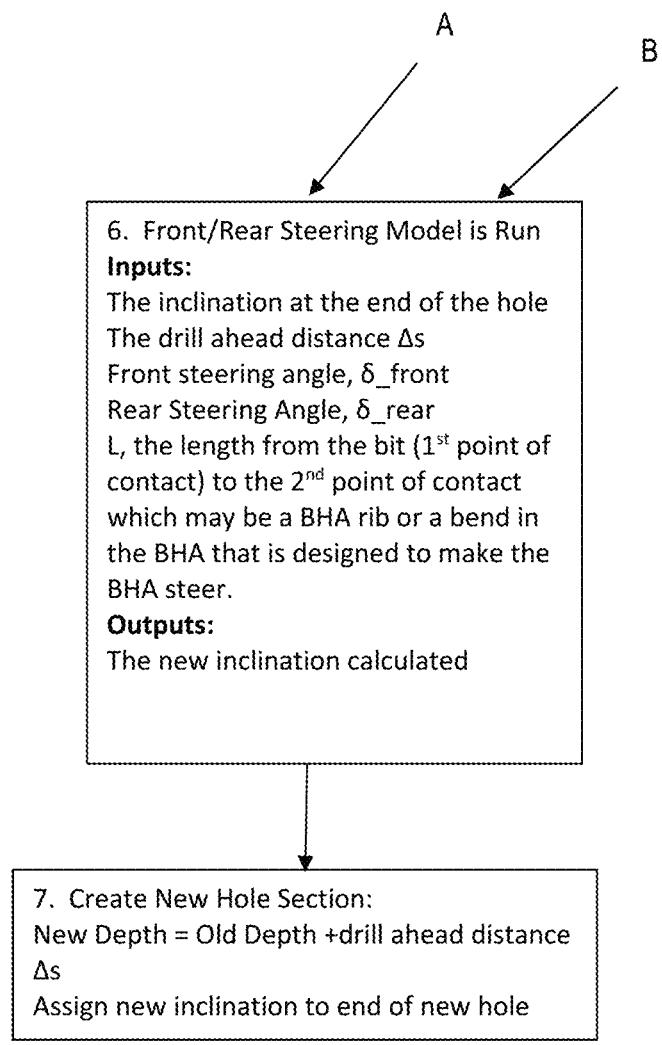

FIG. 5 is a flow chart depicting further details of the drill ahead simulation method 40. In an actual drilling scenario, the general directional behavior of the drill bit will be a governed or influenced by the following factors: WOB/ROP relationship; lateral bit force/lateral ROP relationship; drill bit tilt, drill rotary speed (e.g., RPM); confined compressive strength (CCS) of the formation rock; drilling fluid flow rate (if excessive in weak lithology); and dynamic stability of the borehole as it is being drilled. Hence, these and other factors are included in the models that feed information to the steering model.

Figure 6:
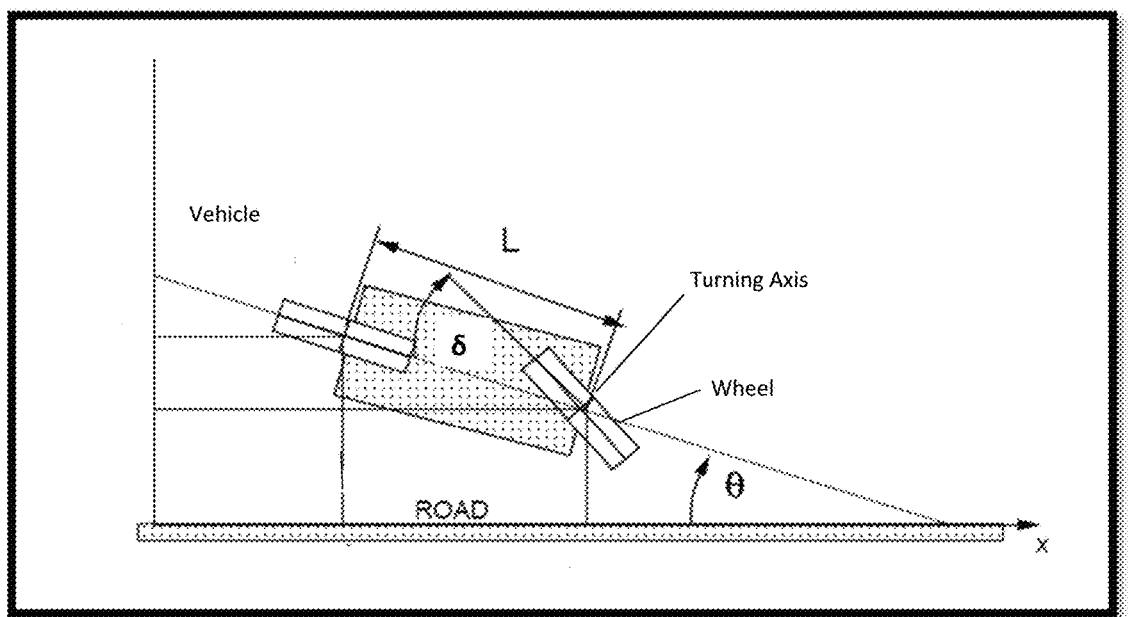
FIG. 6 depicts aspects of a front steering angle model.

Next, the drill string steering model is discussed. The drill string steering model includes a front steering angle model. Steering accuracy may be improved by adding a rear steering angle model to the front steering angle model. The front steering angle model is based on the kinematic motion of a two-wheeled vehicle, such as a bicycle. FIG. 6 illustrates a simple diagram of such a vehicle in a top view and aspects related to a front steering angle.

The following equation describes the angular rate of change with respect to time of the vehicle as a function of the velocity V of the vehicle, the length L of the wheel base, and a front steering angle $\delta$.

$$\dot{\theta} = \frac{V}{L}\tan(\delta(t))$$

The steering angle is the angle between the vehicle's longitudinal axis and the direction that the front wheel is pointing. The front steering angle model makes an analogy between this two-wheeled vehicle and the portion of the BHA from the bit to the first point of contact with the borehole wall. One difference between a bicycle path and directional drilling is that the back wheel of a turning bicycle does not follow the front wheel's path. In directional drilling, the second point of contact of the BHA does follow the path of the bit, which makes the first point of contact with the formation. For simplicity, this difference is neglected at this point.

Figure 7:
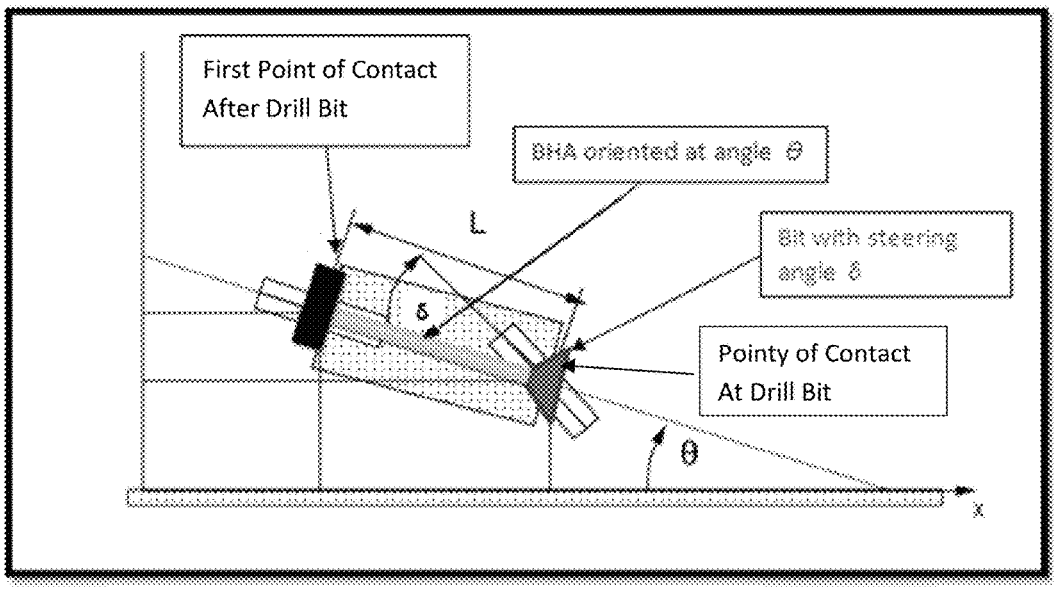
FIG. 7 depicts aspects of the front steering angle model being applied to a BHA.

FIG. 7 depicts aspects of the front steering angle as applied to the BHA. The following parameters are used to describe the BHA drilling the borehole:

$\dot{\theta}$: The time rate of change of the orientation angle of the frame of the $$\text{vehicle} = \frac{d\theta}{dt};$$

V: The velocity of the $$\text{vehicle} = ROP = \frac{ds}{dt};$$

s: The measured depth;

ds: The change in measured depth; and $\delta$: The steering angle of the bit. (Note that this is not bit tilt. No physical part on the bit has necessarily been tilted. The steering angle $\delta$ can be conceptually thought of as the angle between: the axis of the tool (from bit to first point of contact after the bit) and the instantaneous trajectory of the bit.)

As discussed above, the steering angle of the BHA is influenced by certain drilling and lithology parameters. All of these parameters do change in time during a normal drilling run. For now $\delta(t)$ will be denoted as $\delta$, with the assumption that it can change throughout the run as time or depth change because the parameters mentioned above will change with time or depth. Using L to denote the distance from the drill bit to the first point of contact of the BHA after the drill bit, the equation immediately above for $\dot{\theta}$ may be rewritten as:

$$\frac{d\theta}{dt} = \frac{ds}{dt}\left(\frac{\tan\delta}{L}\right).$$

The dt terms in the denominator can be canceled, leading to the following equation:

$$d\theta = ds\left(\frac{\tan\delta}{L}\right).$$

This equation can be rewritten as:

$$\frac{d\theta}{ds} = \left(\frac{\tan\delta}{L}\right)$$

where $d\theta/ds$ is the change in bit axis inclination (and hole inclination) with respect to depth.

The curvature of a circular section (i.e., borehole cross-section) is mathematically defined as:

$$\frac{d\theta}{ds} = \left(\frac{1}{R}\right) = k$$

where R is the radius of the circular survey section and k is the curvature of the circular survey section (i.e., radius of curvature of the borehole at the survey section). Hence, the instantaneous curvature (or curvature for one iteration) may be mathematically described as:

$$k = \frac{d\theta}{ds} = \left(\frac{\tan\delta}{L}\right).$$

This equation can be rewritten to provide the change in inclination angle per change in depth as:

$$\frac{\Delta\theta}{\Delta s} = \left(\frac{\tan\delta}{L}\right).$$

This equation can be manipulated to find the new inclination angle $\theta_{new}$ for the new survey section that the drill ahead simulation method predicts in an iteration. $\theta_{old}$ is the inclination at the hole bottom prior to the creation of the new survey. $\Delta s$ is the distance that the borehole is drilled ahead by simulation during each iteration in the drill ahead simulation method. $\theta_{new}$ may then be written using the front angle steering model as:

$$\theta_{new} = (\Delta s)\left(\frac{\tan\delta}{L}\right) + \theta_{old}.$$

Figure 8:
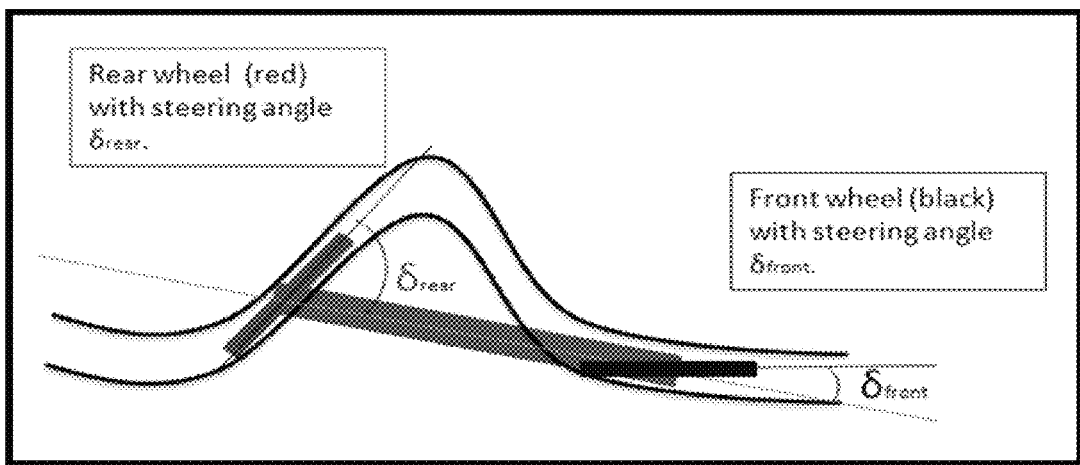
FIG. 8 depicts aspects of a rear steering angle model being applied to the BHA.

As mentioned above, the steering model may be improved by combining the rear angle steering model to the front steering angle model. FIG. 8 depicts aspects of the rear steering angle model. In FIG. 8, the BHA has an imaginary steering front wheel and an imaginary steering rear wheel. The rear wheel must follow the path of the borehole already drilled as if the rear wheel was guiding the BHA at the steering axis of the rear wheel. The rear steering angle model is very similar to the front steering angle model. The only two differences are that now a rear steering angle appears in the formula immediately above, and the cosine of the front steering angle modifies the prediction as well in the following equation:

$$\theta_{new} = \theta_{old} + \Delta s(\cos(\delta_{front}))\frac{[\tan\delta_{front} - \tan\delta_{rear}]}{L}.$$

The rear steering angle $\delta_{rear}$ is the angle between the borehole inclination $\theta$ at the first point of contact of the BHA after the drill bit contact and the tool axis, or it can be defined as the angle between the borehole inclination $\theta$ at the first point of contact after the drill bit and the borehole inclination $\theta$ where the bit contacts the wall. Using the latter definition, the rear steering angle may be written as:

$$\delta_{rear} = \theta_{(first\ contact\ point\ after\ drill\ bit)} - \theta_{contact\ point\ at\ drill\ bit}.$$

Figure 9:
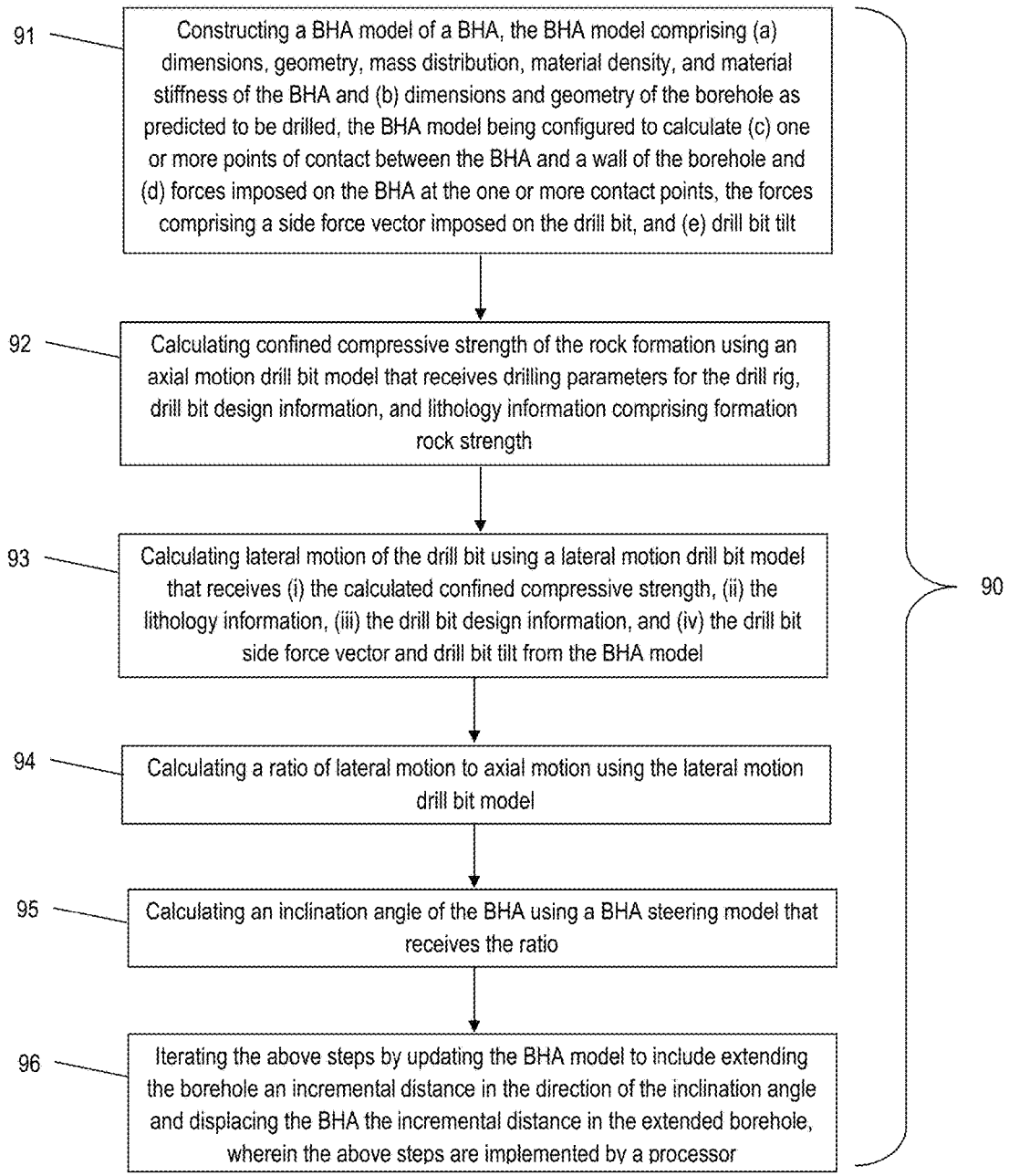
FIG. 9 is a flow chart for a method for predicting a path of a borehole that will be drilled in an earth formation by a BHA having a drill bit coupled to a drill tubular where the BHA being operated by a drill rig.

FIG. 9 is a flow chart for one example of a method 90 for predicting a path of a borehole that will be drilled in an earth formation by a bottomhole assembly (BHA) having a drill bit coupled to a drill tubular, the BHA being operated by a drill rig. Block 91 calls for constructing a BHA model of the BHA. The BHA model includes (a) dimensions, geometry, mass distribution, material density, and material stiffness of the BHA and (b) dimensions and geometry of the borehole as predicted to be drilled. The BHA model is configured to calculate (c) one or more points of contact between the BHA and a wall of the borehole and (d) forces imposed on the BHA at the one or more contact points, the forces comprising a side force vector imposed on the drill bit, and (e) drill bit tilt. Block 92 calls for calculating confined compressive strength of the rock formation using an axial motion drill bit model that receives drilling parameters for the drill rig, drill bit design information, and lithology information comprising formation rock strength. Block 93 calls for calculating lateral motion of the drill bit using a lateral motion drill bit model that receives (i) the axial ROP from the axial motion drill bit model, (ii) the lithology information, and (iii) the drill bit side force vector and drill bit tilt from the BHA model. Block 94 calls for calculating a ratio of lateral motion to axial motion. Block 95 calls for calculating an inclination angle and an azimuthal direction of the BHA using a BHA steering model that receives the ratio. The inclination angle together with the azimuthal direction (e.g., direction or angle with respect to true north) provides a three-dimensional direction. Block 96 calls for iterating the above steps by updating the BHA model to include extending the borehole an incremental distance in the direction of the inclination angle and the azimuthal direction and displacing the BHA the incremental distance in the extended borehole.

Each of the blocks in the method 90 may be implemented by a processor such as in a computer processing system. In addition, data used by the method 90 as input to the various above discussed models may be updated in real time as an actual borehole is being drilled according to drilling parameters that were used to obtain the predicted borehole path. The updated data may be obtained from one or more sensors disposed on a BHA that drills the actual borehole. In this manner, the accuracy of the predicted path can be improved by using the updated data. Sensors may include a borehole caliper sensor and/or a formation sensor that is configured to sense data from which the formation lithology may be derived. Examples of formation sensors include a natural gamma-ray sensor and neutron tools that emit neutrons and sense neutrons or gamma-rays resulting from neutron interactions with the formation.

Next, the axial motion drill bit model (i.e., DRILLBIT) is discussed. The axial bit model is part of the Directional Drill-Ahead simulator. It allows for predicting drilling performance for a specific bit design in a realistic drilling environment and, in particular, uses a PDC cutter force model to calculate the forces on the drill bit. Given operating parameters, formation characteristics and a specific bit design, the axial model predicts the rate of penetration (ROP) if the weight on bit (WOB) is prescribed or predicts the WOB if ROP is prescribed. The overall approach is as follows: (a) from bit design and operating parameters, compute the areas of cut (projected onto a vertical plane) across the face and chamfer for each of the cutters representing the bit; (b) from details of the rock formation, drilling depth and mud weight, estimate the confined compressive strength of the rock formation; (c) given these estimated areas of cut, the detailed geometry of how the edge of the cutter is engaging with the rock and the CCS of the rock formation, calculate forces on the face and chamfer of the cutters using a "force model" (discussed below); (d) and sum the forces on all of the cutters to find the net force on the drill bit. If ROP is prescribed, these forces are easily translated to a WOB (weight-on-bit) and TOB (torque on bit). If WOB is prescribed, an iterative procedure is used by which ROP is adjusted until the predicted WOB matches the prescribed WOB.

If the Directional Drill-Ahead Simulator (DDAS) is drilling with a prescribed ROP, then the only thing passed back from the axial motion drill bit model that the DDAS uses is the CCS and some information on the bit design. However, if the DDAS is drilling with a prescribed WOB, the CCS, ROP and information on the bit design are passed back and used by the DDAS. Specifically, SIDECUT (the lateral motion drill bit model) needs a value of CCS and information on the bit design in order to predict the lateral migration of a bit that has an applied side load.

Figure 10:
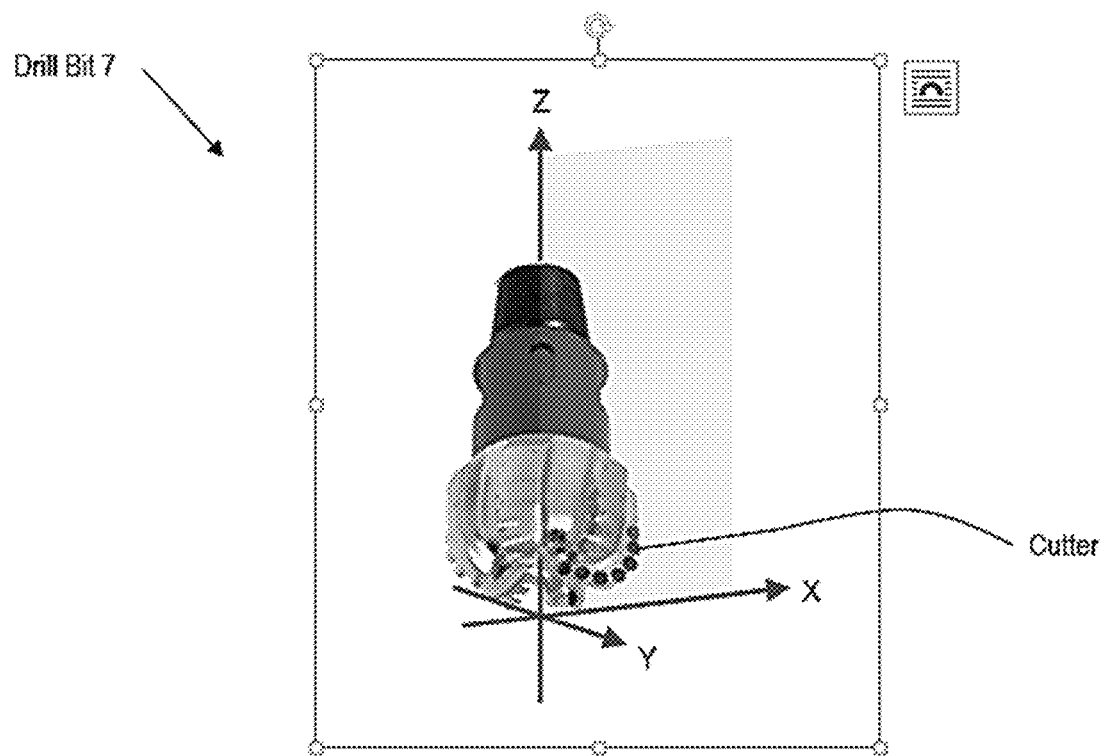
FIG. 10 depicts aspects of a frame of reference of the drill bit.
Figure 11:
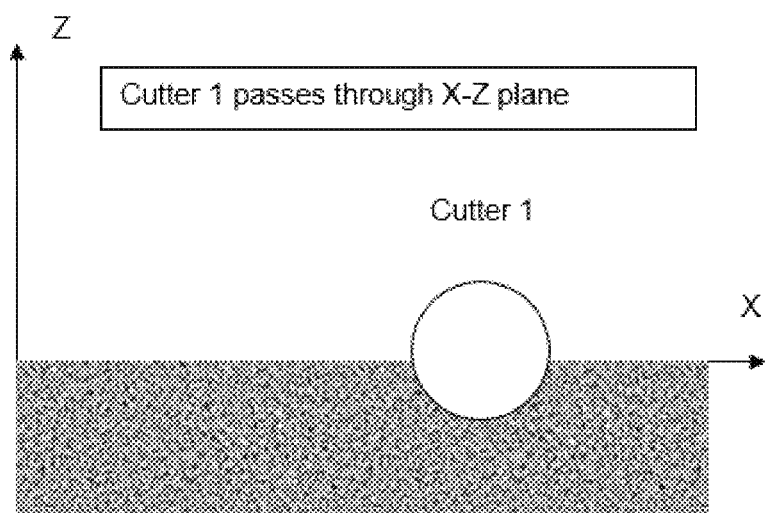
FIG. 11 depicts aspects of a first cutter cutting formation rock.
Figure 12:
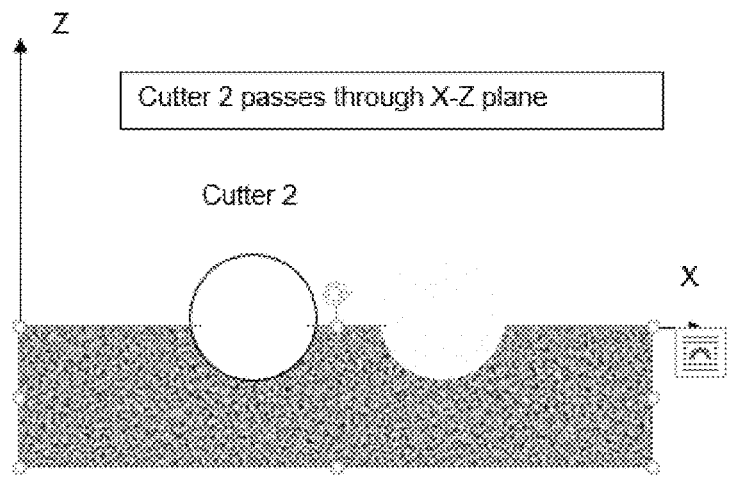
FIG. 12 depicts aspects of a second cutter cutting the formation rock.
Figure 13:
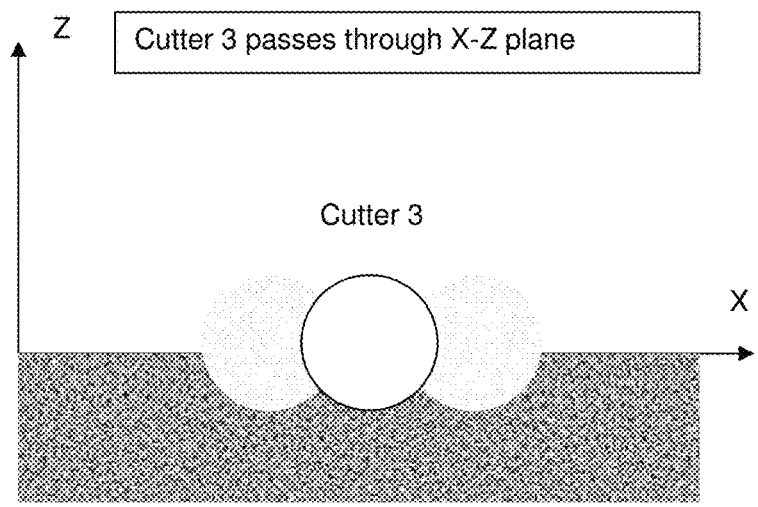
FIG. 13 depicts aspects of a third cutter cutting the formation rock.
Figure 14:
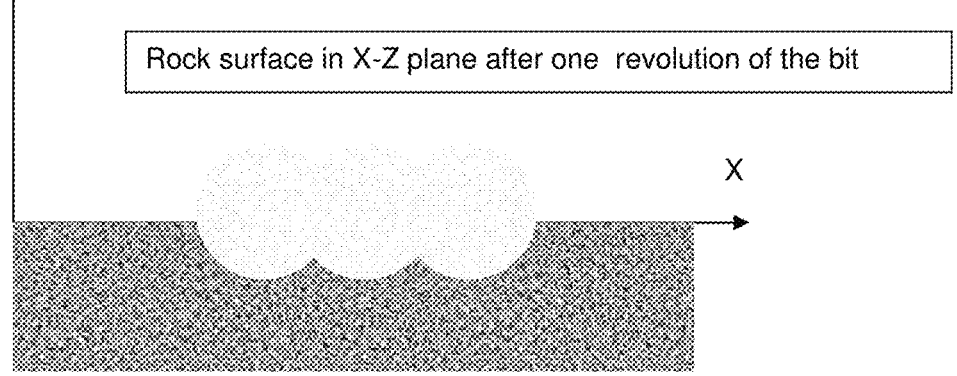
FIG. 14 depicts aspects of the formation rock after being cut by three cutters.

The axial motion drill bit model assumes that the bit is drilling "on-center" and the bit axis of revolution is always coincident with a fixed Z axis in the rock frame of reference as illustrated in FIG. 10. The axial model calculates the areas of cut and forces as each cutter passes through the vertical plane defined as [Y=0, X>0]. In this frame of reference, the Z axis lies on the bit axis of rotation and positive Z is in the direction of nose to shank. The rock surface is defined in this plane as a simply-connected line defined in this vertical plane. FIG. 10 illustrates this frame of reference with the vertical plane superimposed. The drill bit in FIG. 10 is a polycrystalline compact (PDC) bit.

As part of the axial model discussion, drill bit rotation and rock surface update are now discussed. In one or more embodiments, the drill bit and rock surface are modeled using nodes and the node locations are updated based on the drill bit-rock interaction. The cutters on the bit are first sorted in terms of increasing angle around (angular position on the bit). Consider a bit with 3 cutters and parameters listed Table 1.

TABLE 1

| Cutter | Angle around (degrees) | Radial position (in) |
|---|---|---|
| 1 | 0 | 2.5 |
| 2 | 45 | 1.5 |
| 3 | 270 | 2.0 |

The rock surface is updated during one revolution of this bit as follows: (1) the intersection of cutter 1 with the rock is calculated and the rock surface is updated accordingly; (2) the bit is rotated through an angle (45-0) and, based on RPM and ROP, the bit vertical position is modified accordingly; (3) the intersection of cutter 2 with the rock is calculated and the rock surface is updated accordingly; (4) the bit is rotated through an angle (270-45) and, based on RPM and ROP, the bit vertical position is modified accordingly; (5) the intersection of cutter 3 with the rock is calculated and the rock surface is updated accordingly; and (6) the bit is rotated through an angle (360-270) and, based on RPM and ROP, the bit vertical position is modified accordingly. This sequence is repeated until run termination criteria (e.g., a number of iterations) are met. FIGS. 11-14 illustrate the progression of the rock surface update.

Figure 15:
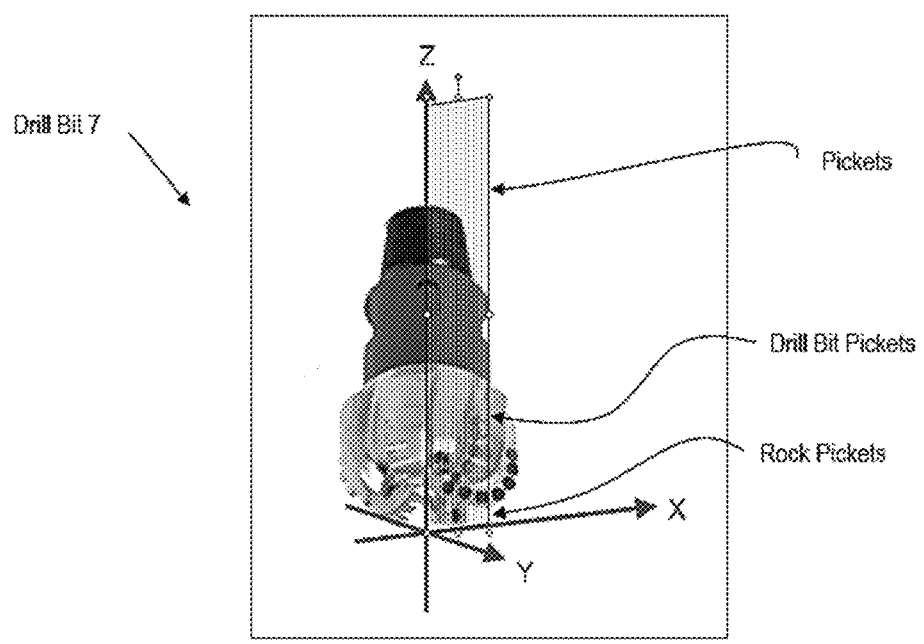
FIG. 15 depicts aspects of pickets used as a virtual representation of the drill bit and the formation rock.

The axial model is computationally fast because in one or more embodiments it is required only to keep track of the rock surface on one 2-D plane and calculate cutter interaction with the rock surface on this plane. This is possible for the situation where the bit is drilling on-center. As a cutter passes the X-Z plane, it clips off the tops of the pickets in order to update the represented rock surface as illustrated in FIG. 15.

Further as part of the axial model discussion, the calculation of the areas of cut is now discussed. In one revolution of the drill bit, the bit moves downward by the amount DZ=ROP/(5×RPM) for a given ROP and RPM. ROP is in ft/hr and DZ is in inches in this equation. If the cutters are sorted in increasing angle around (see previous discussion), the amount of vertical motion DZ' associated between one cutter passing through a vertical plane and next cutter passing through that same vertical plane is simply DZ prorated by the difference DAA in those angle around values as in the following equation.

$$DZ'=DZ \times DAA/360$$

So as each cutter (sorted in increasing angle around) passes through a vertical plane, all of the cutters are moved downward with respect to the rock pickets by the amount DZ'. Comparison of the overlap between the cutters and the rock surface allows for calculating the area of cut of the cutter which is then used in the cutter force model.

Figure 16:
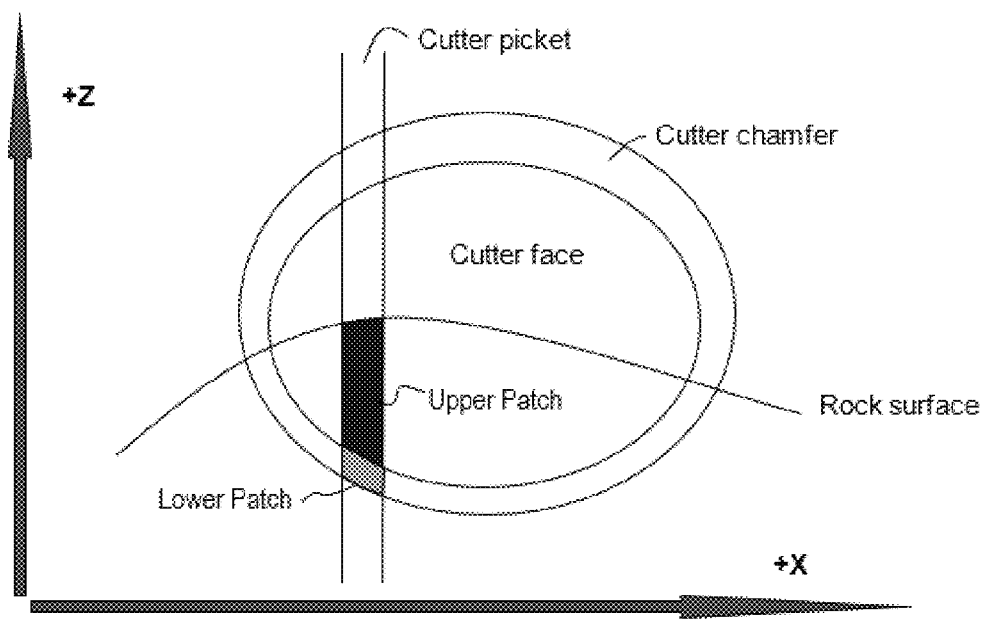
FIG. 16 depicts aspects of a cutter face and cutter chamfer represented by a picket.

The PDC cutters' edges and chamfers are represented initially as ellipses (circles with non-zero back rake projected onto a vertical plane) as they pass through the rock "plane". These are exact (analytic) representations for an unworn cutter with the design back rake and side rake. The ellipses are broken into vertical pickets of user-prescribed width (e.g., default width=0.003"). The rock surface is also broken up into an identical set of pickets that match the location (along the X-axis) of the cutter pickets as illustrate in FIG. 15. FIG. 16 illustrates this configuration. This figure shows the cutter face (with chamfer) with a non-zero back rake coming out of the page at the viewer. If the cutter is allowed to wear, that edge of the cutter in contact with the rock will deviate from an ideal ellipse. This deviation, applied on a picket-by-picket basis, is governed by a wear model discussed in this document further below. The areas of cut are delineated in FIG. 16. The upper patch is the (projected) area of cut on the cutter face and the lower patch is the (projected) area of cut on the chamfer. It is noted that these areas are dependent upon the location of the rock surface with respect to the cutter at a particular picket. The rock surface may only intersect part of a chamfer and none of the face at a picket location. The areas of cut on the chamfers and face are kept track of independently as each will behave differently regarding cutter forces. This is also discussed later. It is also possible for a cutter picket to be completely worn through and no longer exist.

It is noted that vertical pickets are used because it is a natural choice when predicting cutter wear. One cutter picket is associated uniquely with one rock picket. With this choice, there may be some error introduced at the flanks of the cutter. The force model discussed below has extensive bookkeeping to account for pickets that intersect only the chamfers and pickets that intersect both the chamfers and face of the cutter.

Figure 17:
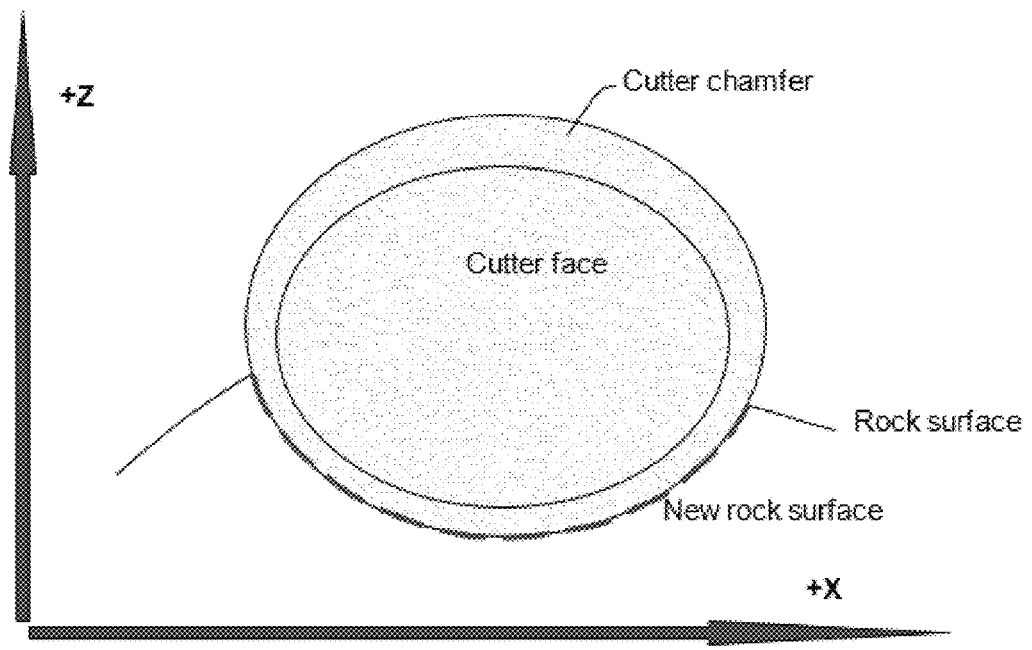
FIG. 17 depicts aspects of rock cut by the cutter face and the cutter chamfer.

Further as part of the axial model discussion, the updated rock surfaced is now discussed. The new rock surface (after a cut) is generated by clipping the rock pickets at the bottom-most position of the cutter pickets. This is illustrated by the dashed lines in the FIG. 17. This figure shows the updated rock surface for a new cutter. If the cutter is worn, the updated rock surface will simply be the bottom-most end of a picket when the picket takes a cut. If the picket does not take a cut, the rock surface at that location does not change.

Figure 18:
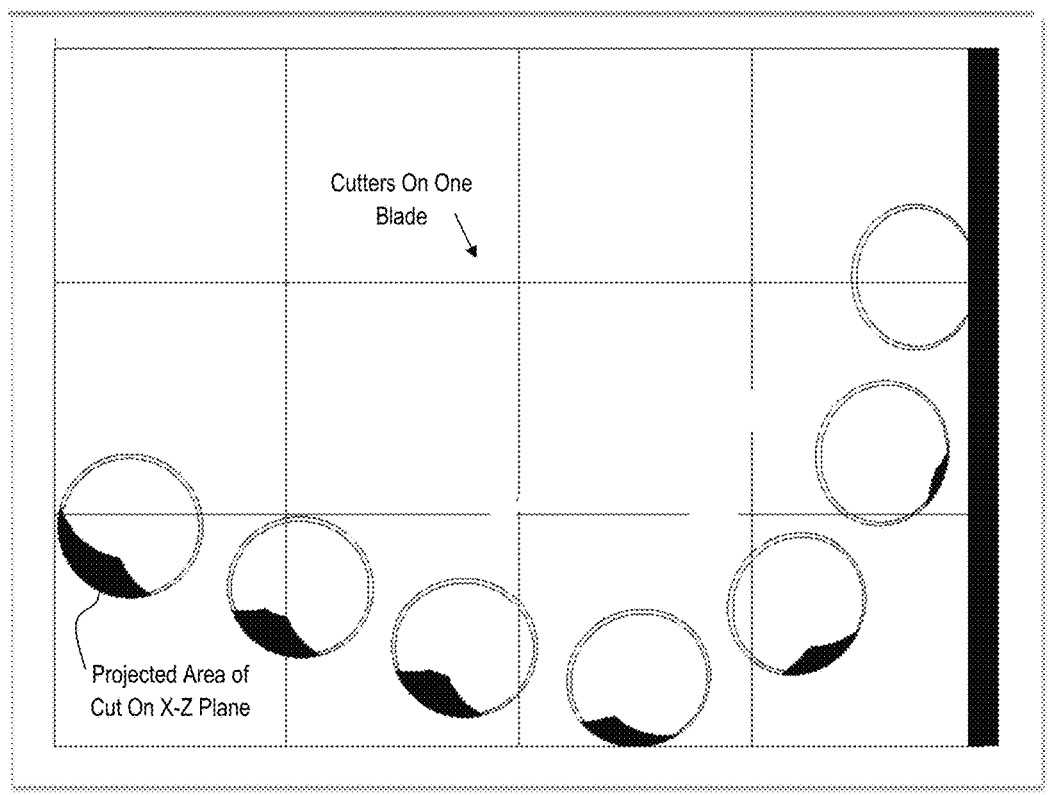
FIG. 18 depicts aspects of a projected area of cut rock on a R-Z plane by a series of cutters on one cutter blade on the drill bit.

Further as part of the axial model discussion, the cutter interaction is now discussed. There is generally overlap in the radial extent of adjacent (in the radial coordinate) cutters. The shape and magnitude of the area of cut depends upon the radial overlap of these cutters and their respective angles around. FIG. 18 illustrates an example. This example represents the areas of cut for all cutters on a single blade of a PDC bit. Areas of cut on a cutter, and the forces associated with these areas of cut, depend both on the cutter layout on the bit and operating parameters (e.g., RPM, ROP). After a few revolutions of the bit, the magnitude and shape of the areas of cut stabilize to constant values for a fixed ROP and RPM. The viewer is advised that the image in FIG. 18 is a general "bit profile" image generated by the axial model. The cutters and respective areas of cut have, for the purpose of plotting only, been rotated back to the X-Z plane with the helix angle taken into consideration. The reason for this is two-fold: (1) so that the image will conform to a typical engineering "side view" of the bit and (2) that the geometry of the area of cut is plotted within its associated cutter.

Figure 19:
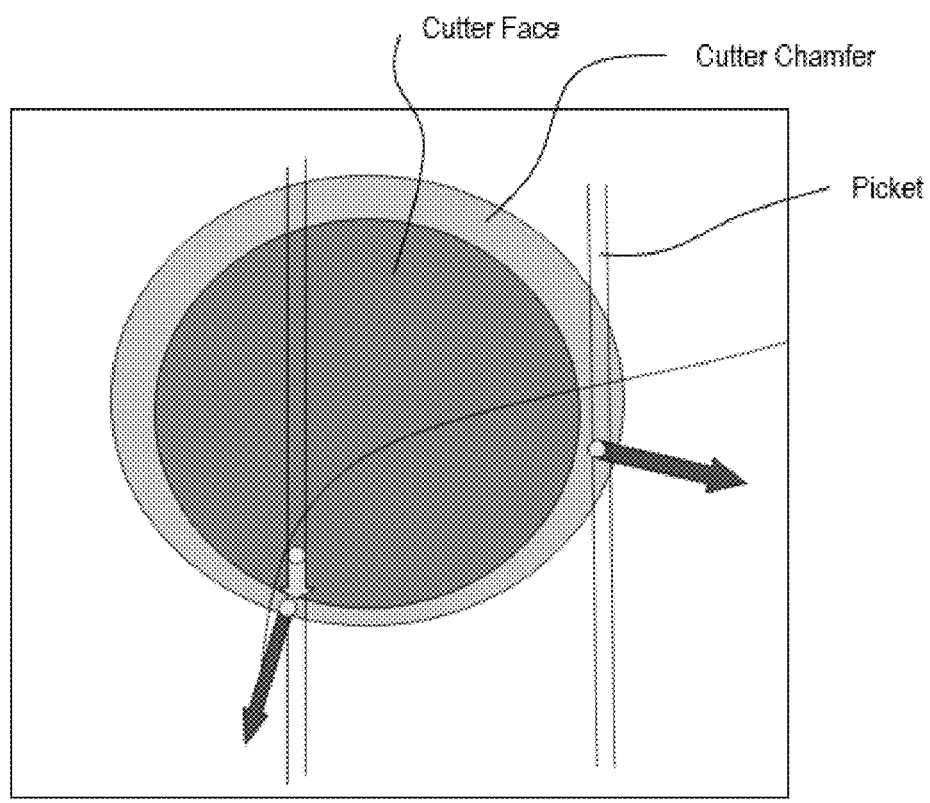
FIG. 19 depicts aspects of a chamfer cutter coming out of the page with two superimposed pickets.

Further as part of the axial model discussion, the effective back rake of a cutter is now discussed. The effective back rake is an angle plays a role in cutting forces. Effective back rake is not the design back rake found in a bit design file. The two are associated but that is all. Effective back rake is the angle between the (normal to the) local cutting surface and the local rock surface. FIG. 19 illustrates a chamfer cutter coming out of the page. Two pickets are superimposed on the image. The two large arrows represent the surface normals of the cutter chamfer at the locations of the pickets. The small arrow is the surface normal at the cutter face at the location of one of the pickets. The dots represent vectors coming out of the page and are parallel with the local rock surface that the cutter will see as it passes through the rock. The effective back rake (EBR) is that angle between this vector and the arrows. As is evident, the EBR can depend upon location on the cutter . . . both along the edge of the cutter and whether or not the cut is on the chamfer or on the face.

Figure 20:
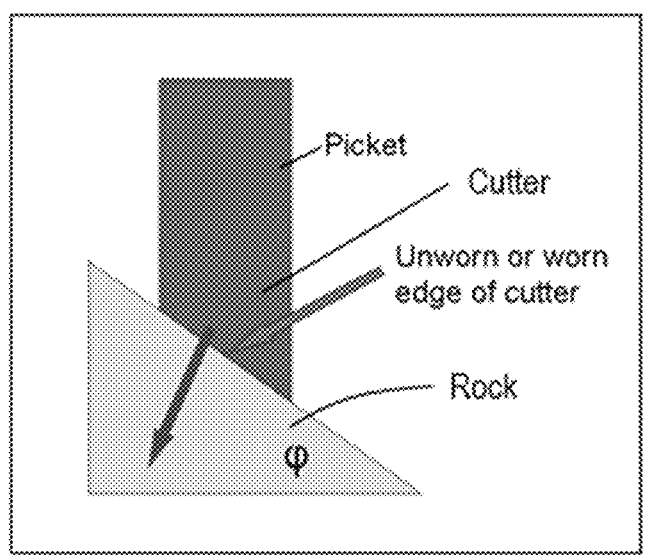
FIG. 20 depicts aspects of a cutter represented by a picket at a rock interface.

FIG. 20 is a close-up of the bottom of a picket edge (at edge of cutter). The edge of the cutter is delineated by the contact between the picket and the triangle. The vector arrow into the cutter is the normal to the local cutter surface (either on a chamfer or on the face). Note that this normal vector is in three dimensions and has three components, each associated with an axis in a right-handed coordinate system. There is a component of the normal vector coming out of the page. The angle φ is referred to as the "cut" angle.

A simple 2D rotation operator is constructed that will rotate the bottom edge of the picket into the horizontal plane. This operator is applied to the 3D normal to the local cutter surface (red vector in image above). If the resulting rotated normal vector (normalized) has components (Nx, Ny, Nz), where X and Z have been defined previously (see section entitled "Reference Frame") and Y is "out of the screen, then the effective back rake (EBR) and effective side rake (ESR) are given by:

$$EBR = \text{TAN}^{-1}\left[\frac{N_z}{N_y}\right]$$

and $$ESR = \text{SIN}^{-1}(N_x).$$

These expressions for EBR and ESR are computed on a picket-by-picket basis for all of the pickets intersecting a cutter.

Figure 21:
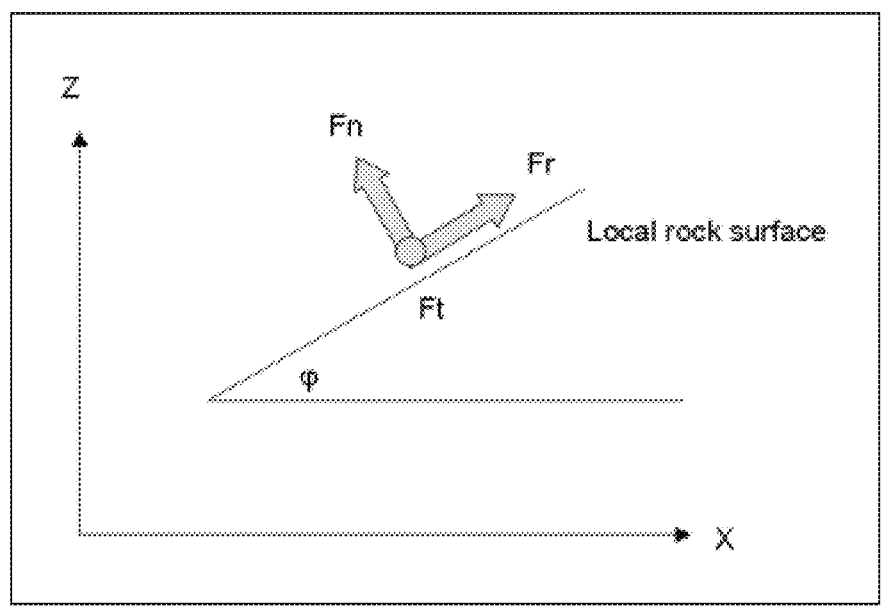
FIG. 21 depicts aspects of three orthogonal forces imposed on a cutter by a local rock surface interfacing with the cutter.

Further as part of the axial model discussion, the forces on cutters are now discussed. The forces on a cutter are computed by summing the forces on individual pickets that span the cutter. Forces on an individual picket will depend upon the area of cut on the chamfer, the area of cut on the face, the effective back rake, the rock formation, confined compressive strength (CCS), drilling depth and mud weight. Details of the force model are given in a different section. Once the normal (Fn) and circumferential (Ft) forces are computed on a picket, they are transformed back into the bit frame of reference. The net force on the bit is a summation of the individual cutter forces which are themselves the summations of individual picket forces. Consider FIG. 21 illustrating the local (picket) rock surface with the normal (Fn), tangential (Ft), and radial (Fr) forces generated by the force model. The force model is applied on a picket-by-picket basis. Fn is always normal to the local rock surface (regardless of the orientation of the local rock surface with respect to the earth). Ft is in the direction normal to the X-Z plane and Fr is perpendicular to the plane containing Fn and Ft.

With this nomenclature, the following force components can be defined.

Components of $F_N$ in XYZ Frame
$F_{NZ} = F_N \cos(\varphi)$
$F_{NY} = 0$
$F_{NX} = F_N \sin(\varphi)$
Components of $F_R$ in XYZ Frame
$F_{RZ} = F_R \sin(\varphi)$
$F_{RY} = 0$
$F_{RX} = -F_R \cos(\varphi)$
Components of Ft in XYZ Frame
$F_{TZ} = 0$
$F_{TY} = F_T$
$F_{TX} = 0$ At this point, one could simply add all the Z components to get the weight on cutter, all the Y components to get the circumferential force and all of the X components to get the radial force. This however does not take into consideration the helix angle. Keep in mind that the force model is in the frame of reference of the local rock surface. Therefore, a correction for helix angle α must be made. The final equations for the forces on a particular picket are given by the following equations.

$WGT$ (vertical force) = $(F_{NZ} + F_{RZ})\cos(\alpha) + F_{TY}\sin(\alpha)$ $SID$ (side force) = $F_{NX} + F_{RX}$ $CIR$ (circumferential force) = $-(F_{NZ} + F_{RZ})\sin(\alpha) + F_{TY}\cos(\alpha)$ $TRQ$ (torque on picket) = $R_{pic} CIR$ (see below for definition of $R_{pic}$)

It is noted that the helix angle is computed for each picket and is given by the following equation:

$$\alpha = TAN^{-1}\left[\frac{ROP}{10 \pi R_{pic} RPM}\right]$$

where ROP is penetration rate (ft/hr), RPM is bit rotary speed, and Rpic is radial position of picket (distance from bit axis to picket in horizontal plane).

Figure 22:
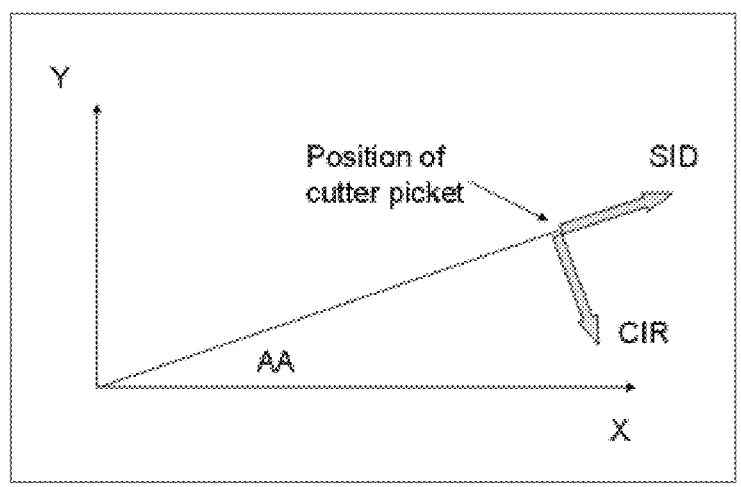
FIG. 22 depicts aspects of circumferential (CIR) and side (SID) forces imposed on a cutter by a local rock surface interfacing with the cutter.

These force components on a picket are illustrated graphically in FIG. 22. In FIG. 22, AA is the angle around of the cutter and CIR and SID are defined as above. Note that the viewer is looking down onto the horizontal plane from shank to nose. In the XYZ frame of reference, and referring to FIG. 22, the forces on a picket are given by the following equations.

$dF_X = CIR \sin(AA) + SID \cos(AA)$ $dF_Y = SID \sin(AA) - CIR \cos(AA)$ $dF_Z = WGT$ The total force on a cutter is simply a summation of these forces for all (N) pickets associated with that cutter, as given by:

$$F_X = \sum_N dF_X$$

$$F_Y = \sum_N dF_Y$$

$$F_Z = \sum_N dF_Z$$

where N is the number of pickets associated with a particular cutter. The net force and moment on the bit is thus a summation of forces and moments on all of the cutters on the bit.

Next, the cutter force model is discussed. The forces on a PDC cutter are given by two orthogonal components: a "tangential" component that is parallel with the local rock surface and a "normal" component that is perpendicular to the local rock surface. Note that when evaluating such things as weight on bit and torque on bit, Fn and Ft must be transformed to the bit frame of reference. The model is defined by the following equations:

$F_t = \varepsilon A$ $F_n = \zeta F_n$ where
$F_t$ = cutting force parallel with local rock surface;
$F_n$ = cutting force perpendicular to local rock surface;
$\varepsilon$ = "intrinsic specific energy";
A = projected area of cut; and
$\zeta$ = ratio of Fn to Ft (dependencies to be defined).

Figure 23:
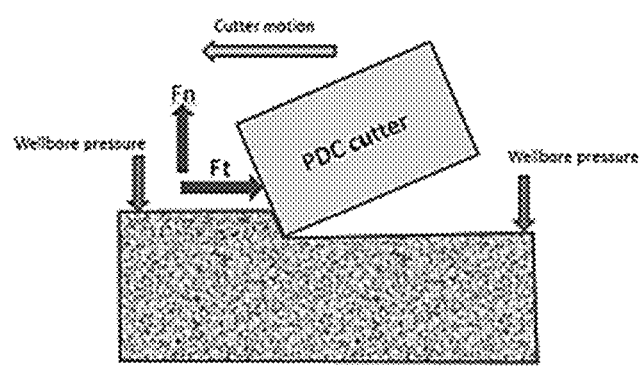
FIG. 23 depicts aspects of a relationship between a cutter and a local rock surface interfacing with the cutter.

FIGS. 23 and 18 define the PDC cutter in relationship to the rock. FIG. 23 is a side view of a cutter moving through the rock, with Fn and Ft indicated. FIG. 18 shows one blade of a PDC bit with the cutters coming out of the page. FIG. 18 illustrates what in meant (in the following) by the projected areas of cut (blackened areas) associated with the rock removed.

The cutter force model is extended to a practical form by identifying the nature of "intrinsic specific energy" and developing a means of characterizing its value, on a site-specific basis, from well logs, drilling depth and mud weight.

Next, the intrinsic specific energy ε aspects of the cutter force model are discussed. The "intrinsic specific energy" term ε is the effective cutting strength (or resistance to be cut) of the rock. This effective strength will depend upon the following: wellbore pressure; hole depth; mud weight; lithology; cutter orientation on the bit; cutter geometry (face/chamfer); and cutter interfacial friction coefficient. The cutter orientation on the bit and the orientation of the formation rock with respect to the bit provide an orientation of the cutter with respect to the formation rock to be cut, which is accounted for in the intrinsic specific energy as disclosed herein. It is assumed that the "intrinsic specific energy" is equivalent to the confined compressive strength of the rock with the modification that this confinement also includes confinement due to the cutter, mud column, and pore pressure effects. The confined compressive strength (CCS) is taken to be the unconfined compressive strength (UCS) modified by a term associated with the confining pressure and is defined as follows:

$$CCS = UCS + \frac{1+\text{SIN}(FA)}{1-\text{SIN}(FA)}CP$$

where CCS is confined compressive strength (computed); UCS is unconfined compressive strength (from well log); FA is internal angle of friction (from well log); and CP is confining pressure (computed from well log, mud weight and drilling depth). Note that the confined compressive strength (CCS) equals the unconfined compressive strength (UCS) when there is no confining pressure (CP=0). The confining pressure CP in the expression will depend upon hole depth, mud weight and lithology and is discussed further below.

Figure 24:
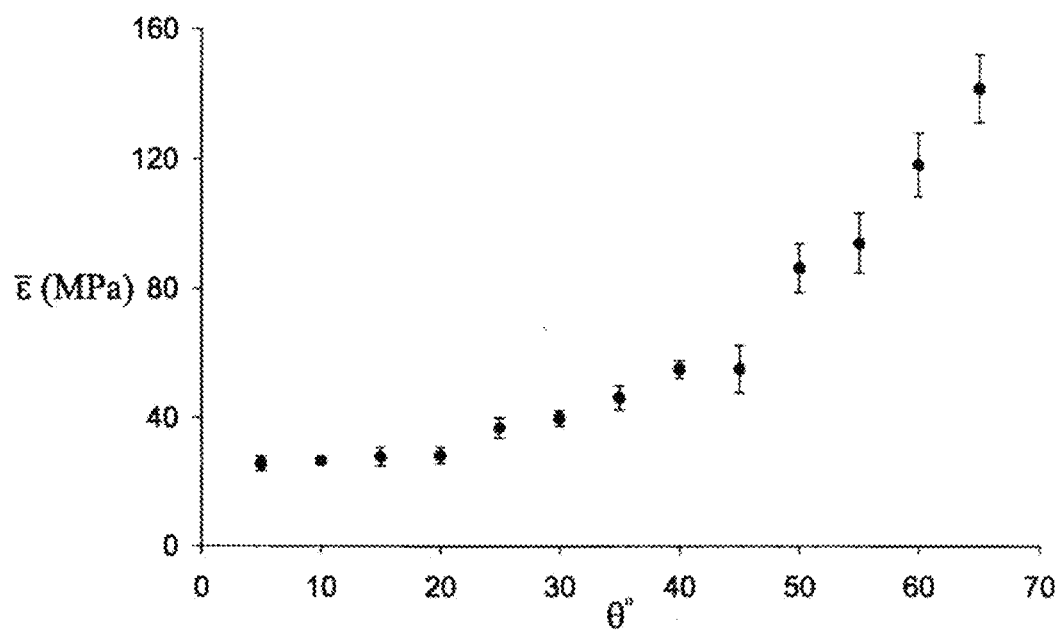
FIG. 24 depicts aspects of intrinsic specific energy required to cut rock as a function of cutter back rake angle.

The intrinsic specific energy cannot be equated to the CCS because c can be backed out as a function of cutter back rake $\theta$ as illustrated in FIG. 24 for Vosges sandstone under atmospheric conditions. From FIG. 24, it is clear that the strength of the rock increases with increasing cutter back rake. This is associated with the additional confinement of the rock by the cutter. The intrinsic specific energy c is close to the uniaxial compressive strength of Vosges sandstone at $\theta=0$. We therefore conclude that the intrinsic specific energy can be represented, to first approximation, by the algebraic form: $\varepsilon=\gamma(\theta)$ CCS where a reasonable functional form (see FIG. 24) for $\gamma$ is taken as: $\gamma(\theta)=1+A_2 \text{ TAN } (\theta)$. $A_2$ is a multiplicative parameter included in order to allow adjustment during model fitting to lab or field data.

Figure 25:
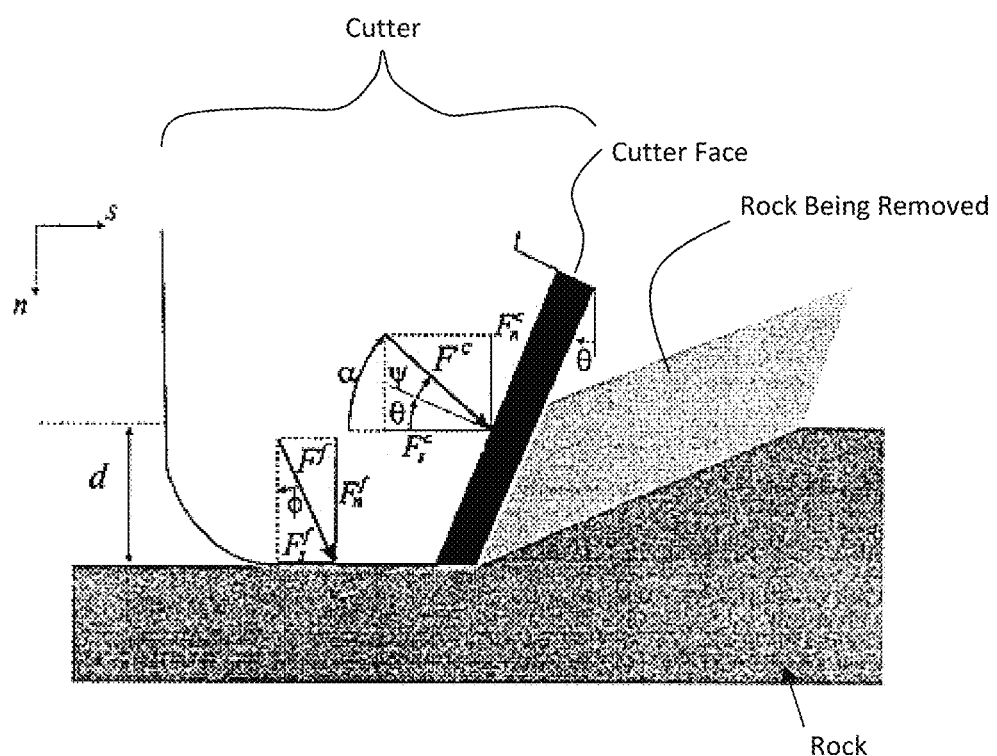
FIG. 25 depicts aspects of forces acting on a cutter.

Next, the cutter force inclination aspects of the cutter force model are discussed. The ratio of Fn to Ft is also not a simple matter. FIG. 25 illustrates the forces acting on a cutter. The cutter back rake is given by $\theta$ and $\psi$ is the inclination due to friction of the net cutting force from the perpendicular to the cutting face. From FIG. 25, the ratio may be expressed as:

$$\frac{F_n}{F_t} = \text{TAN}(\theta + \psi)$$

where the inclination of the net cutter force with respect to the rock surface is given by $\alpha=\theta+\psi$. Therefore the following association may be made:

$$\zeta(\theta,\psi)=\text{TAN}(\theta+\psi).$$

Figure 27:
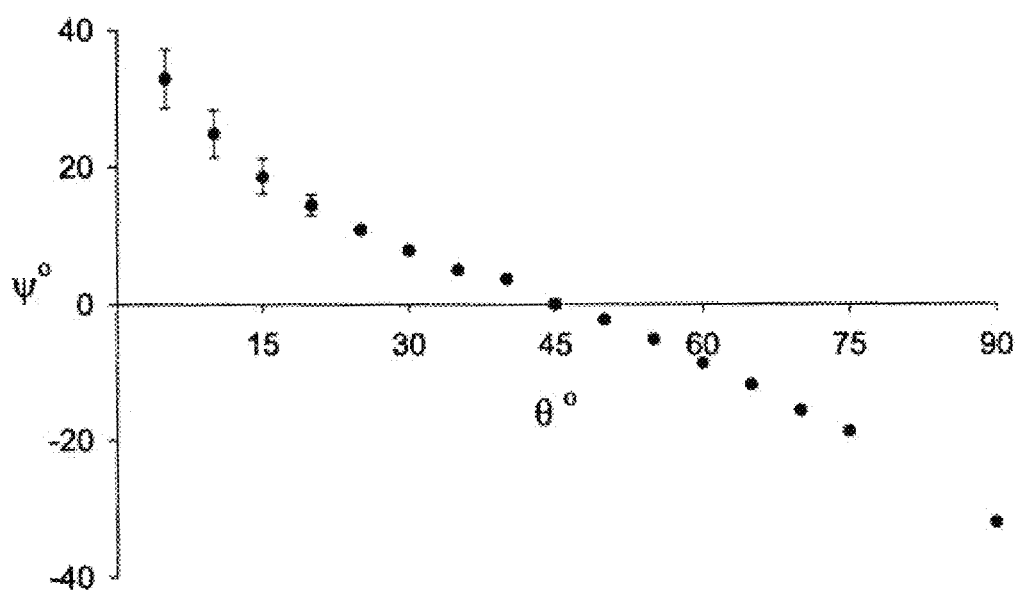
FIG. 27 depicts aspects of force model parameter $\psi$ as a function of back rake parameter $\theta$ for Voges sandstone.

The effective back rake $\theta$ is a well-defined parameter. $\psi$ on the other hand is not so straight-forward. Depending upon the degree of back rake, the rock can "flow" upward along the cutter face or downward beneath the cutter as illustrated in FIGS. 26A-26C. Based on laboratory experiments on Voges sandstone, the relationship of $\psi$ with back rake $\theta$ is illustrated in FIG. 27. Noting that the data is more or less symmetrical about $\theta=45$ degrees in FIG. 27, the following form for $\psi$ may be inferred:

$$\psi=\text{TAN}^{-1} [C\mu(90-2\theta)/90]$$

where $\theta$ is in degrees and $C\mu$ is a constant that can be related to the interfacial friction coefficient between the cutter and the rock. It is noted that $C\mu$ can be considered a free parameter and can be determined by fitting laboratory drilling data to the model and thus it is not required that it be related to some physical mechanism. Note that in the discussion that follows, the force model coefficient $A_3=C\mu$.

Next, the confining pressure aspects of the cutter force model are discussed. The confining pressure (CP) model is one of the key elements of a successful "drill ahead" simulation. The confining pressure model used in DRILL-BIT differentiates between permeable and impermeable formations based on a lithology log according to the following.

$$\Sigma_{imperm}=\% \text{ Shale}+\% \text{ Coal}+\% \text{ Polyhalite}+\% \text{ Sand-shale mix}+\% \text{ Anhydrite}$$

$$\Sigma_{perm}=\% \text{ Sandstone}$$

The percents are the fractions of the indicated rock types and, at every depth, the sum of these fractions is unity. If the formation is deemed impermeable, the CP at that depth is simply the bottom hole pressure (BHP) that is calculated from the hole depth and the mud weight according to: CP (psi)=BHP=0.052×depth (ft)×mud weight (ppg). If the formation is deemed permeable, the confining pressure is the above minus the pore pressure: CP (psi)=$\Delta$P where $\Delta$P=0.052×depth (ft)×[mud weight (ppg)-Pp] and Pp=max [8.5, mud weight (ppg)-0.5]. The effective porosity of the formation and the confining pressure CP (used in the confined compressive strength calculation) is calculated according to the following:

$$\Phi_{eff}=[1-\Sigma_{imperm}]\varphi$$

$$CP=\Delta P, \Phi_{eff}>0.2$$

$$CP=BHP, \Phi_{eff}<0.05$$

$$CP=\Delta P[\Phi_{eff}-0.05)/0.15]+BHP[(0.2-\Phi_{eff})/0.15].$$

$\varphi$ is the measured porosity of the formation or porosity inferred from well log data. Note that the last entry above is an interpolation between the maximum allowed CP (namely BHP) and the minimum allowed CP (namely $\Delta$P) and that this interpolation is based on effective porosity.

Next, the mud weight correction factor aspects of the cutter force model are discussed. A mud weight correction factor is implemented in DRILLBIT. The correct interpretation of this effect is via the "chip hold-down effect" that has to do with the dislodgement of a chip created in the cutting process. If fluid cannot migrate between the produced chip and the formation from whence it came, the chip is subject to the entire load of the fluid column and the formation is tougher to drill. However, if fluid can migrate into the fractures and equilibrate the stresses on the chip, the chip can be removed easily. Since a fluid migration through generated cracks in this mechanism, the migration will depend upon mud viscosity (related to mud weight) and will be independent of whether the formation is initially permeable or impermeable. The mud correction factor is:

$$\eta=2.998-0.8876 \text{ log(mud weight)}$$

where the mud weight is given in pounds per gallon (ppg).

Next, aspects of implementing the cutter force model are discussed. The force model is applied independently to the cutter chamfer and the cutter face. Depending upon the operating parameters all or part or none of the chamfer pickets and face pickets will be engaging the rock. The associated "bookkeeping" for this is an integral part of the axial bit model. Many well logs do not give a specific lithology (sandstone, limestone, etc) at a particular depth but rather a mix of lithologies in terms of fractional content. In general, the sum of the fractions at a given depth is unity. The axial model accommodates this by: (i) assigning (through lab or field calibration on specific lithologies) values to the force model coefficients A1, A2, A3 and (ii) weighting these force model coefficients at a specific depth according to the fraction of the associated lithology. For example, if at some depth, the log indicates 25% shale and 75% limestone. Then, at this depth: A1=0.25×A1shale+ 0.75×A1limestone; A2=0.25×A2shale+0.75×A2limestone; and A3=0.25×A3shale+0.75×A3limestone.

Figure 28:
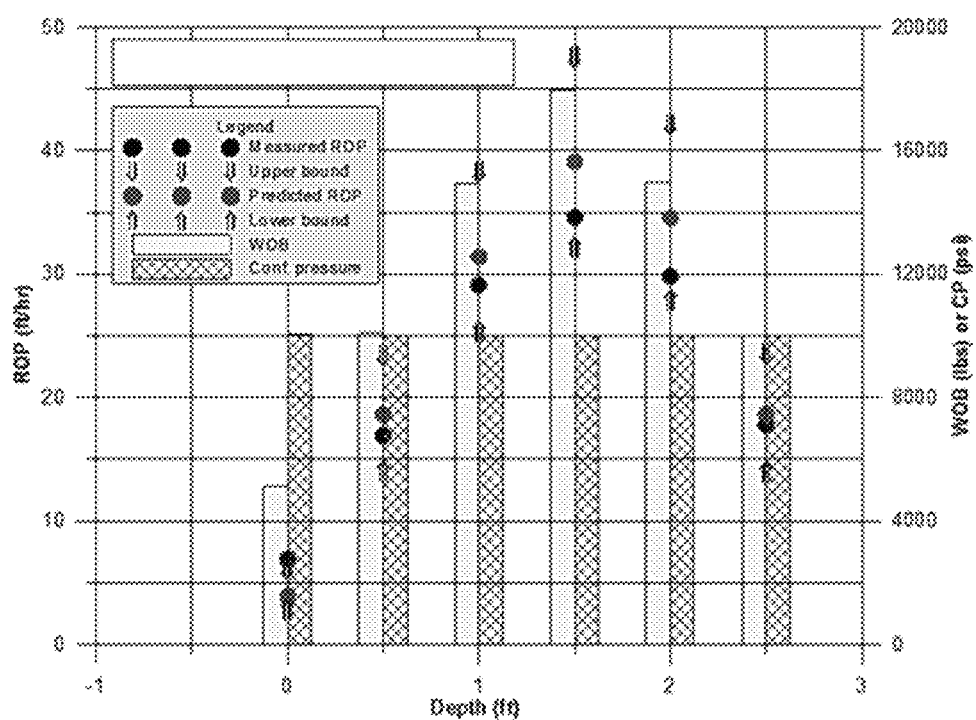
FIG. 28 depicts aspects of a comparison of predicted versus measured weight on bit in a first laboratory drilling simulator test.
Figure 29:
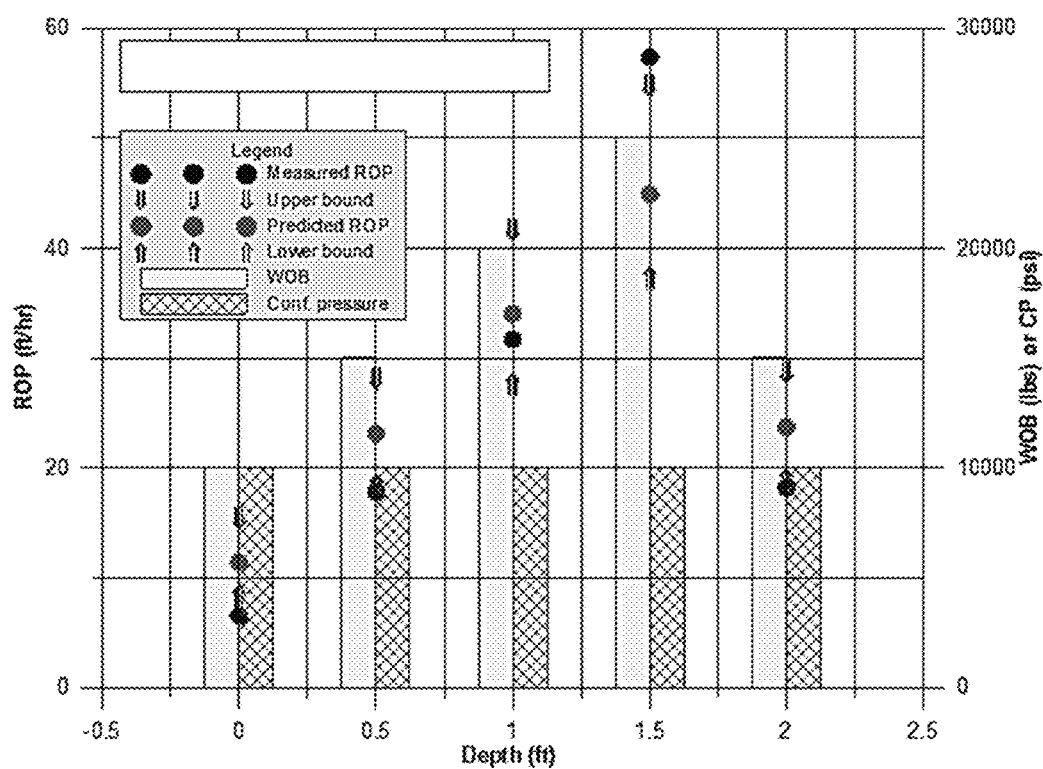
FIG. 29 depicts aspects of a comparison of predicted versus measured weight on bit in a second laboratory drilling simulator test.
Figure 30:
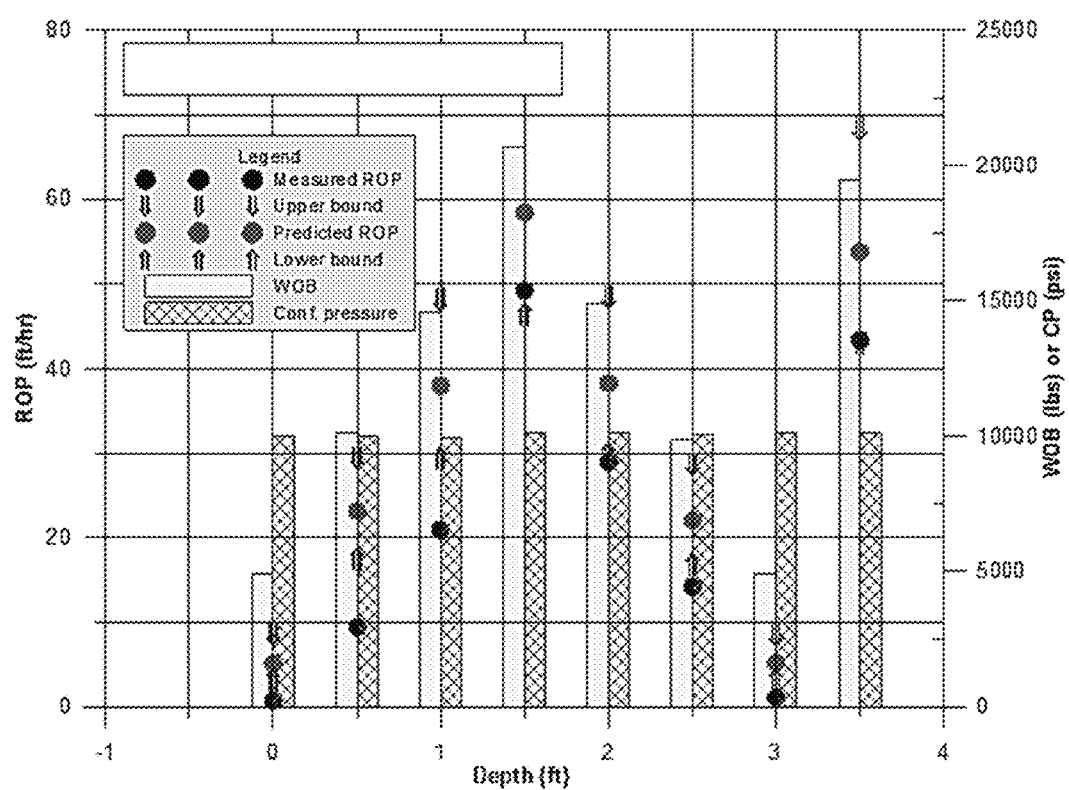
FIG. 30 depicts aspects of a comparison of predicted versus measured weight on bit in a third laboratory drilling simulator test.
Figure 31:
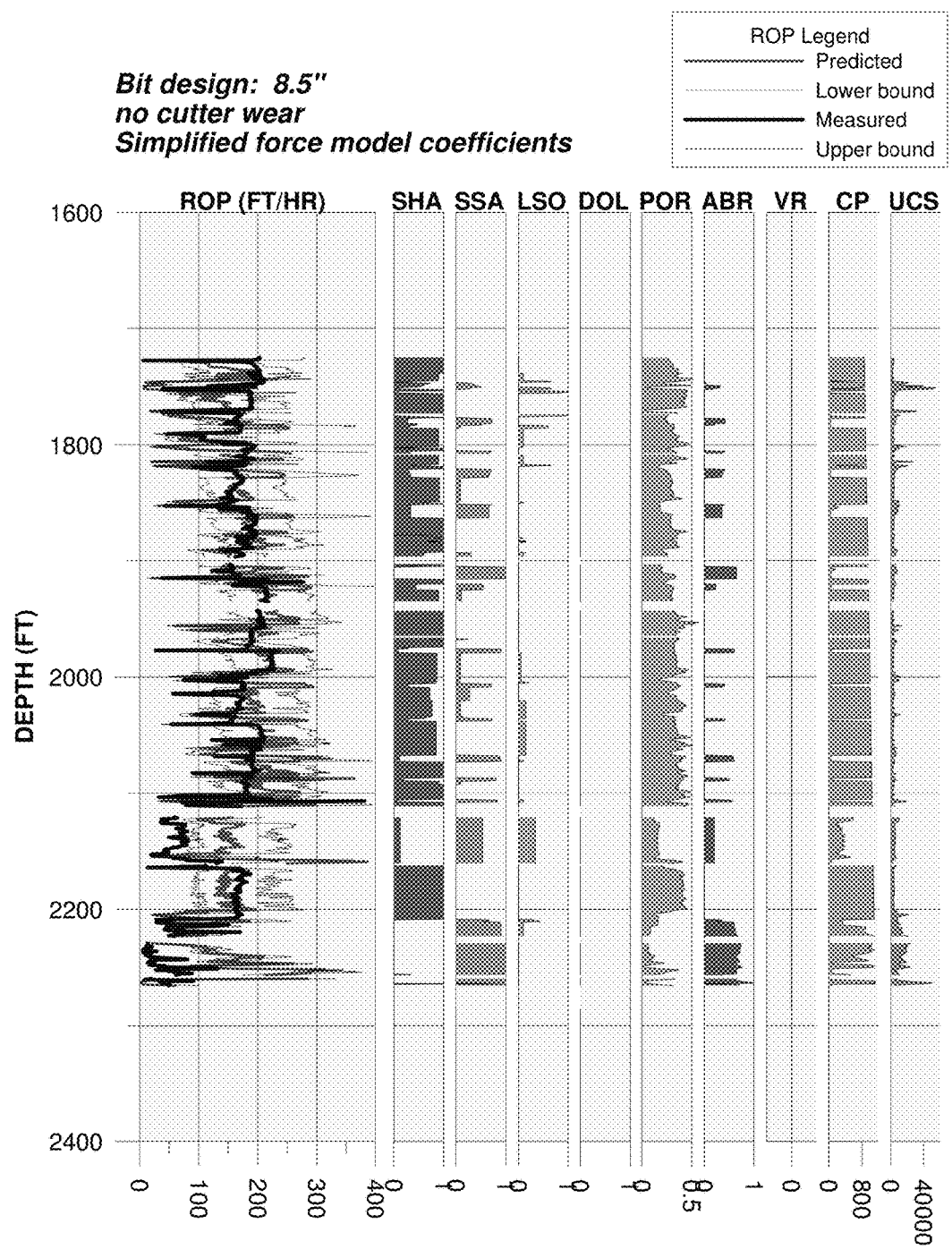
FIG. 31 depicts aspects of a comparison of predicted versus measured rate of penetration at an actual field location.

Next, examples are presented using DRILLBIT. FIGS. 28-30 represent a comparison of predicted and measured weight on a few laboratory drilling simulator tests. During each drilling test, the prescribed WOB was changed and the measured ROP was recorded. The upper and lower bounds in these plots were computed by propagating uncertainties in porosity, friction angle and UCS through DRILLBIT. In FIG. 28, the drilling fluid was water and the rock was Carthage limestone. In FIG. 29, the drilling fluid was 11 lb. water-based drilling mud and the rock was Carthage limestone. In FIG. 30, the drilling fluid was 16 lb. oil-based drilling mud and the rock was Mancos shale. Another example is a comparison of predicted with measured ROP at an actual field location as illustrated in FIG. 31. The lithology log from this site along with the actual drill bit design used in the field, and actual WOB applied to the bit was used to predict the ROP. The legend for this plot is: SHA: fraction of shale; SSA: fraction of sandstone; LSO: fraction of limestone; DOL: fraction of dolomite; POR: formation porosity; CP: predicted confining pressure; and UCS: unconfined compressive strength.

Figure 32:
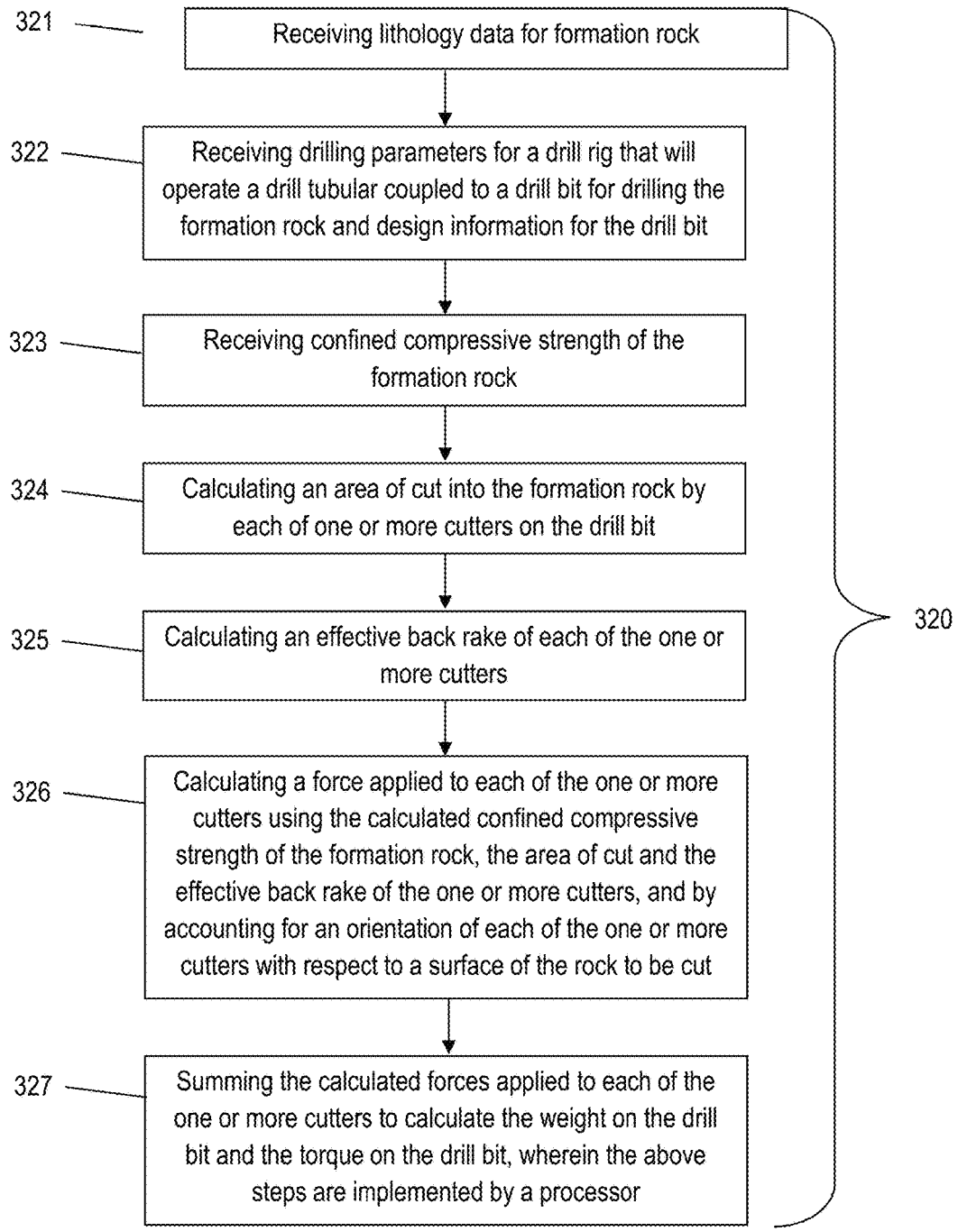
FIG. 32 is a flow chart for a method for predicting an amount of axial motion of a drill bit having one or more cutters for drilling a borehole into a formation rock.

FIG. 32 is a flow chart for a method 320 for predicting an amount of axial motion of a drill bit having one or more cutters for drilling a borehole into a formation rock. Block 321 calls for receiving lithology data for the formation rock. Block 322 calls for receiving drilling parameters that include mud weight and depth of drill bit for a drill rig that will operate a drill tubular coupled to the drill bit and drill bit design information. Block 323 calls for calculating confined compressive strength of the formation rock using the received lithology data, drilling parameters, and drill bit design information. Block 324 calls for calculating an area of cut into the formation rock by each of the one or more cutters. Block 325 calls for calculating an effective back rake of each of the one or more cutters. Block 326 calls for calculating a force applied to each of the one or more cutters using the calculated confined compressive strength of the formation rock, the area of cut and the effective back rake of the one or more cutters, and by accounting for an orientation of each of the one or more cutters with respect to a surface of the rock to be cut. Block 327 calls for summing the calculated forces applied to each of the one or more cutters to calculate the WOB and TOB (torque-on-bit). The above method may be implemented by a processor. If ROP is prescribed, then the method 320 may be used to calculate the WOB and TOB that provides the prescribed ROP. Alternatively, if WOB is prescribed, then the ROP and TOB may be calculated to provide the prescribed ROP. If WOB is prescribed, then values of ROP and TOB may be varied to calculate the resulting WOB and comparing this value to the prescribed WOB until an acceptable difference or zero difference is achieved. The method 320 may call for representing the drill bit with a first set of virtual pickets and the formation rock with a second set of virtual pickets. In one or more embodiments, the first set of pickets lines up with the second set of virtual pickets at the interface of the drill bit with the formation rock. That is, if the first set of pickets was extended downward and the second set of pickets was extended downward, the two sets of pickets would overlap. When the pickets are used, the area of cut, the effective back rake, and the force applied to each cutter are calculated on a picket by picket basis, and the WOB and TOB are calculated by summing the forces on each of the pickets.

Figure 33:
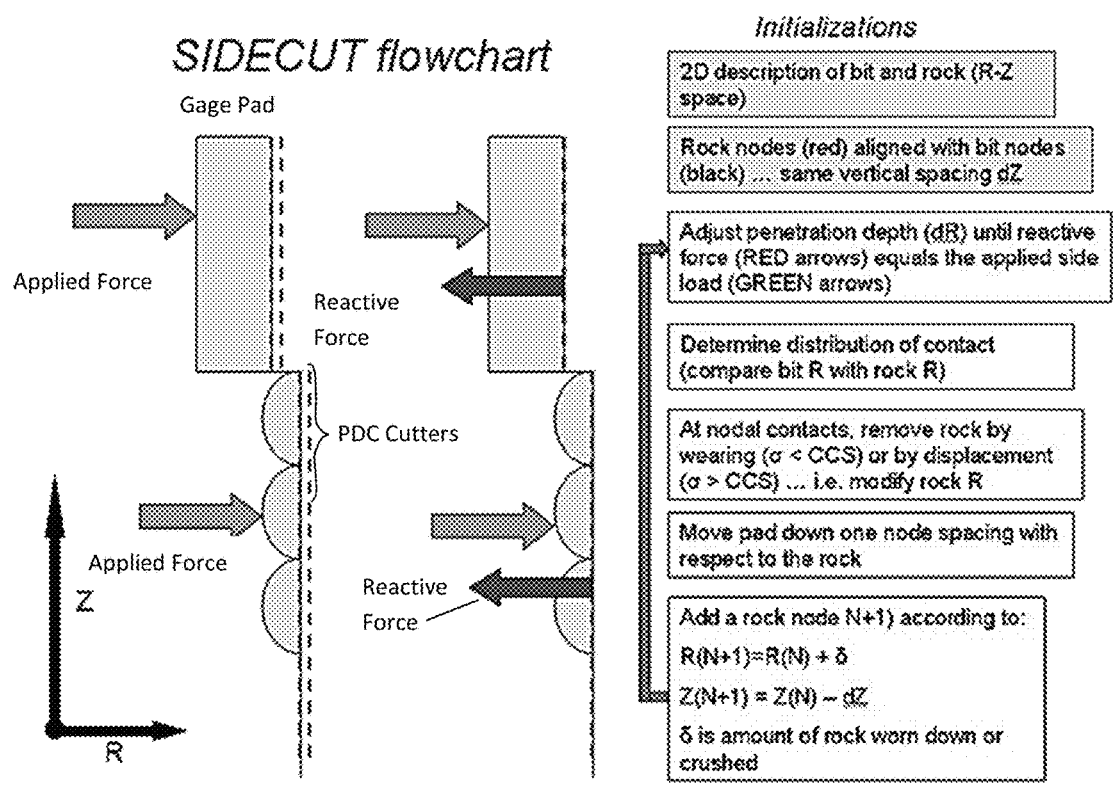
FIG. 33 is a flow chart for depicting aspects of a lateral motion drill bit model.
Figure 34:
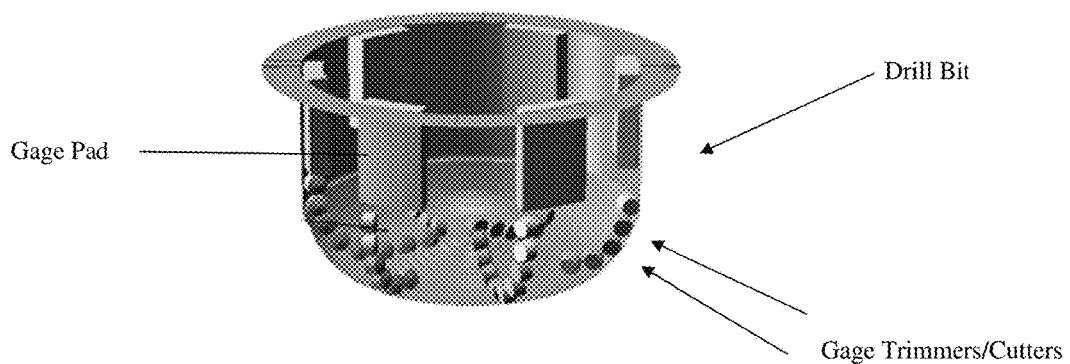
FIG. 34 depicts aspects of a drill bit having gage pads configured to wear or crush formation rock and gage trimmers configured to cut formation rock.

Next, the lateral motion drill bit model (i.e., SIDECUT) is discussed. SIDECUT is a program/procedure for calculating the lateral migration dL (with respect to the borehole) of a drill bit drilling a rock formation as a function of drilling depth (dZ) along the borehole. FIG. 33 is a flowchart depicting aspects of the SIDECUT procedure. The drill bit can have a tilt (with respect to the borehole) and an applied side load that forces the drill bit against the borehole wall. SIDECUT may be used for PDC bits, roller cone bits, and hybrid bits combining aspects of PDC bits and roller cone bits. FIG. 34 depicts aspects of a PDC bit in three-dimensional view.

The procedure allows for arbitrary values of: bit rate of penetration (ROP) through the rock formation; bit rotary speed (RPM); bit tilt with respect to the bore hole side load applied to the drill bit; bit geometry (gage pad length, gage pad recess, fraction of bit circumference occupied by gage pads); and confined compressive strength (CCS) of rock formation. In one or more embodiments, the CCS is calculated in DRILLBIT, which provides the CCS to SIDECUT.

Figure 35:
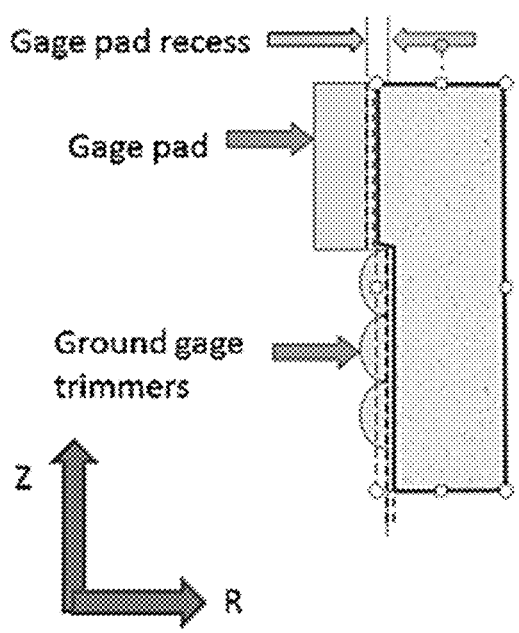
FIG. 35 depicts aspects of a relationship of a gage pad with gage trimmers.

The gage pad recess, defined as the radial distance that gage pads are recessed inward from the position of the outermost edge of the ground gage (PDC) trimmers, can vary with respect to vertical position on the gage pad. This allows for tapered, stepped, and other gage pad geometries. FIG. 35 illustrates these aspects in a two-dimensional representation.

SIDECUT uses a two-dimensional (2D) description of the drill bit and rock formation. The reason for this is computation speed. However, a full three-dimensional (3D) model can be implemented using more computational time. There is excellent agreement between the simplified 2D model and the more sophisticated 3D model.

In FIG. 34 the 3D characterization of the PDC bit illustrates the PDC cutters (small cylinders) and the gage pads (rectangular structures). The collection of PDC cutters and associated gage pad is referred to as a "blade". In FIG. 35, the 2D characterization illustrates a single blade and shows the gage pad and PDC cutters ("ground gage trimmers") below the gage pad. The blade is being forced to the right against the rock with an applied side load. The dotted line in FIG. 35 is the initial rock surface in SIDECUT. The rock is simply "shrink wrapped" to the bit in order to initialize the rock surface and is indicated by the filled region to the right. Note that the outer surface of the gage pad in FIG. 35 is recessed in radial (R) position from the outer edge of the ground gage trimmers. This is referred to as "gage pad recess" and is significant in governing the directional drilling properties of a PDC drill bit. The vertical (Z) extent of the gage pad is called the "gage pad length" and the fraction of the drill bit circumference that is occupied by gage pads is simply referred to as "fraction" in the following discussion.

SIDECUT accounts for both bit geometry and rock wear in computing the lateral migration of a bit in a bore hole. Rock wear is estimated using a sliding wear model. The amount of rock worn off at a particular position on the bore hole wall is proportional to the total sliding distance of the gage pads across that position as well as the contact stress applied to that location and the confined compressive strength of the rock formation. Sliding distance is governed by the bit RPM, ROP, gage pad length and "fraction". Contact stress is governed by the applied side load and instantaneous rock-pad contact area.

The SIDECUT procedure is now discussed in more detail.

1. Initializations. Drill Bit Construction: Construct the 2D bit by constructing a series of equally spaced (vertically) points or nodes from the top of the gage pad to the bit nose. Differentiate those points associated with the gage pad from those point associated with the PDC cutters. Let the vertical spacing be a prescribed value DZ. The totality of PDC Cutters below the gage pads are represented by a single vertical construction with a prescribed back rake. This series of equally spaced nodes can have an arbitrary shape in R-Z space (see graphic above). This generality can therefore encompass tapered and stepped gage pads. The methodology also can allow for a 2D bit profile although the implementation described herein simply assumes a continuous vertical blade as representative of the PDC cutting structure.

Rock Construction: The initial rock surface is series of equally spaced (vertically) points or nodes that is a clone of the initial drill bit representation. The rock node locations are initially identical to the bit node locations. Assign a stiffness (spring constant) K to the rock. As a gage pad is pushed into the rock, the restoring force by the rock on the gage pad is governed by the depth of penetration of the pad into the rock and that depth is governed by the rock stiffness. The rock stiffness can depend upon rock properties or other parameters as provided by a lithology log for example. The associated equation for pad-rock contact stress is:

$$\sigma = K\Delta$$

where $\Delta$=pad penetration depth (in) and K="stiffness" (psi/inch).

2. Processing Loop. The processing loop includes three procedures discussed in the following: force balancing, rock removal and hole growth. At each vertical position of the drill bit with respect to the rock, all three of these procedures are applied in the order given below for this example. The bit is then moved by an amount DZ (see FIG. Y2) and the process is repeated until some prescribed drilling distance is achieved. This distance is generally a multiple of the gage pad length.

A. Balance Restoring Force of Rock on Bit to Equal the Applied Side Load on Bit.

Referring to FIG. 35: (a) move the bit laterally; (b) calculate the depth of penetration of the pad into the rock and the PDC cutters in the rock by comparing the lateral (R) positions of the bit nodes with the rock nodes; (c) calculate the forces on the gage pads and PDC cutters on a node by node basis according to methodology discussed in a force model below; (d) sum all of the nodal forces (pad and cutter) to get the net restoring force of the rock on the bit and compare with the prescribed side load; (e) calculate the difference between the net restoring force and prescribed side load; and (f) use this difference in a root finding procedure until the net restoring force equals the prescribed side load (go to "a").

Force on gage pad by a single pad node is now provided. The contact force on a single pad node is:

$$F = \sigma dA$$

where $\sigma$ is the pad-rock contact stress as presented above and dA=$2\pi R$ FR DZ/N where R=bit radius, FR=fraction of bit circumference occupied by pads, DZ=vertical node spacing, N=number of blades on bit, and dA is the total pad area for a single pad over the vertical distance DZ.

Force on PDC cutters by a single rock node is now provided. The restoring force of the rock on the cutter depends on the depth of cut of the cutter into the rock. This force is assumed to be perpendicular to the rock surface for this example. The PDC cutter force model discussed further in the section on DRILLBIT (other cutter force models may also be used), is given by:

$$F_N = \zeta \, F_T$$
$$F_T = MSE \, AOC$$
$$MSE = \gamma CCS$$
$$\gamma = 1 + A_2 \tan(EBR)$$
$$\zeta = \tan(EBR + \chi)$$
$$\chi = \tan^{-1}\left(\frac{A_3(90 - 2EBR)}{90}\right)$$
$$AOC = \Delta \, dZ$$

where MSE is mechanical specific energy, CCS is the confined compressive strength, AOC is area of cut, EBR is effective back rake, $\Delta$ is depth of cut (penetration depth), and A2 and A3 are force model calibration coefficients.

B. Rock Removal by Gage Pads and PDC Cutters.

At this stage, the restoring force of the rock on the bit has been balanced by the prescribed side load applied to the bit. Rock is removed by the bit either by wearing the rock (pads), crushing the rock (pads) or cutting the rock (PDC cutters). Rock removal is done on a node-by-node basis for all of the nodes representing the bit (pads and cutters).

Rock removal by pads. On a node-by node basis on the set of rock nodes that are adjacent to the pads, check to see if the contact stress exceeds the CCS. If so (and this is optional by the user), the rock node can be adjusted to simply reflect displacement. That is, the new R location of the rock node is at the R position of the respective pad node. If the contact stress is less than the CCS, the new rock node R position is governed by the sliding wear model. The amount $\delta$ a rock node is moved in the +R direction due to wear is given by:

$$\delta = dx \cos(TILT)$$
$$dx = dL \frac{XK}{1 + XB \, CCS} \left[\frac{\sigma}{CCS}\right]^{XN}$$
$$dL = FR \, 2\pi R \, RPM \, \Delta t$$
$$\Delta t = 5 \, dZ/ROP$$

where: TILT=bit tilt (inclination of the bit with respect to the hole axis, radians), dL=sliding distance of pads over a given rock node in one depth step dZ, FR=fraction of bit circumference occupied by pads, RPM=rotary speed, ROP=penetration rate (ft/hr), R=bit radius (in), CCS=confined compressive strength (psi), $\sigma$=contact stress at rock node location (see previous) (psi), $\Delta t$=length of time for bit to drill the distance dZ (min), dZ=depth step (=prescribed vertical node spacing) (in), and XK, XN, XB are wear model coefficients (lab calibrated). There is no change in the Z coordinate of the rock node. Note also that if the pad node is not contacting its adjacent rock node, the rock node position remains unchanged.

Rock removal by cutters. The Z-coordinate of the rock node does not change but the "new" R position of the rock node is simply the outer position of the cutter. That is, the lateral position of the "cutter" nodes on the bit, which must be greater (larger R coordinate) than the adjacent rock node. If not, nothing is cut and the rock node remains unchanged.

C. Borehole Growth.

The final piece of the computation is to grow the borehole by the amount dZ. This is done only at the end of going through all of the rock nodes and removing rock according to the previous section. Recall that dZ is the prescribed vertical node spacing for both the bit and the rock. So once the rock is removed according to the previous section, a single rock node is added. If at this point there are N rock nodes, then:

$$R(N+1)=R(N)+dZ \tan(\text{TILT})$$

$$Z(N+1)=Z(N)-dZ.$$

It is noted that the R(N) above already takes into account the rock removal described in the previous section. Also note that the Z coordinate is positive-up. That is why the "−dZ" in the new rock node vertical position.

Rather than actually move the bit down for the next time step, the indices of the rock is simply adjusted. As an example, the penetration depth A of the pad at rock node k is:

$$\Delta(k)=PAD_R(j)-\text{ROCK}_R(k), k=j+\text{ISHIFT}$$

where the depth of the rock node is $Z=(j+\text{ISHIFT}-1)\times dZ$. The top of the pad is aligned with the top of the rock when ISHIFT=0. J is an index that simply spans the pad nodes as originally set up. This technique, along with the fact that this is a static 2D model rather than a dynamic 3D model, is why SIDECUT runs quickly on a computer processing system.

3. Post analysis. At this point, the lateral displacement L of the bit as a function of drilling depth Z is obtained. A line is fit to this data to get the slope dL/dZ which is a measure of the lateral agressivity of the bit for the conditions prescribed for the simulation. This line-fitting procedure is automated within SIDECUT.

Figure 36:
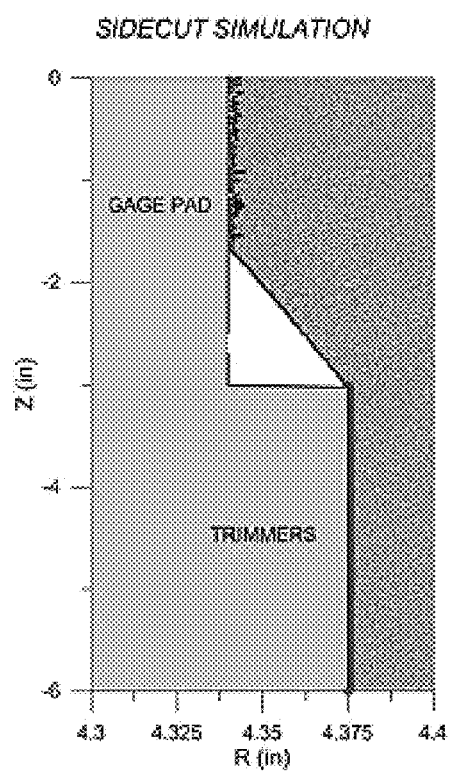
FIG. 36 depicts aspects of a simulation of laterally removing the formation rock with the gage pad and the gage trimmers.
Figure 37:
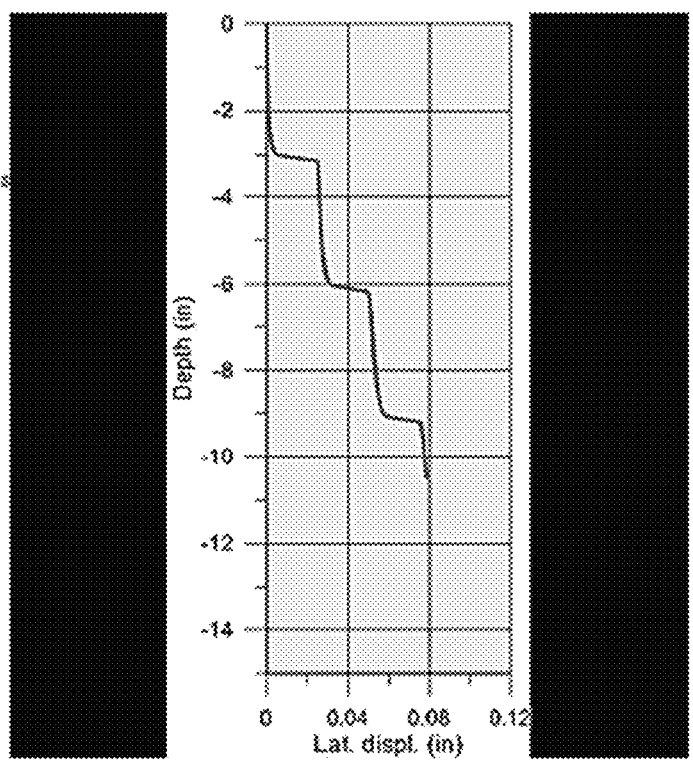
FIG. 37 depicts aspects of lateral displacement as a function of axial displacement for the simulation.
Figure 38:
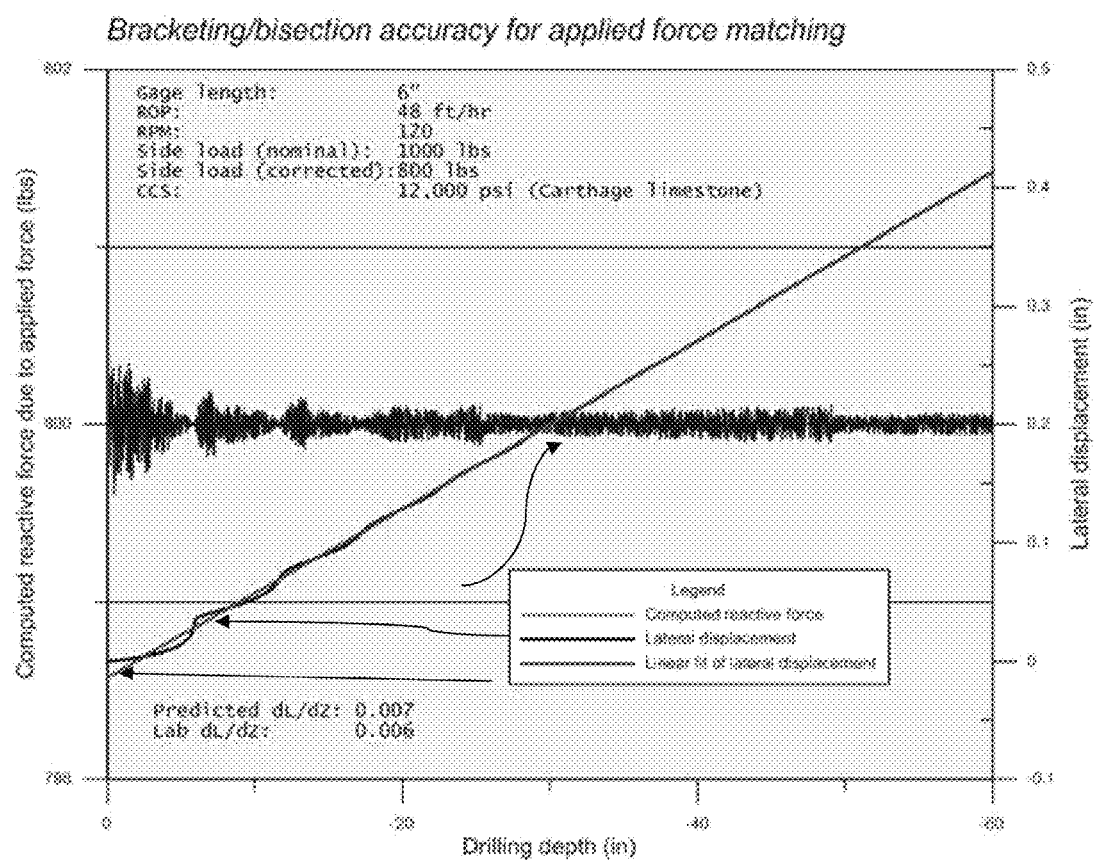
FIG. 38 depicts aspects of a comparison of predictions using the lateral motion drill bit model with measured laboratory side load drilling experiments in Bedford limestone.

FIG. 35 illustrates rock and drill bit geometry half-way through a SIDECUT simulation of drilling a borehole. FIG. 36 illustrates a graph of axial depth versus lateral side cut for the simulation illustrated in FIG. 35. FIG. 37 illustrates results of force balancing at each depth step during a SIDECUT simulation with a prescribed side load of 800 lbs. FIG. 37 illustrates the sensitivity of gage pad contact area to bit RPM and gage pad length. FIG. 38 illustrates aspects of a comparison of SIDECUT predictions with measured laboratory side load drilling experiments in Bedford limestone.

Figure 39:
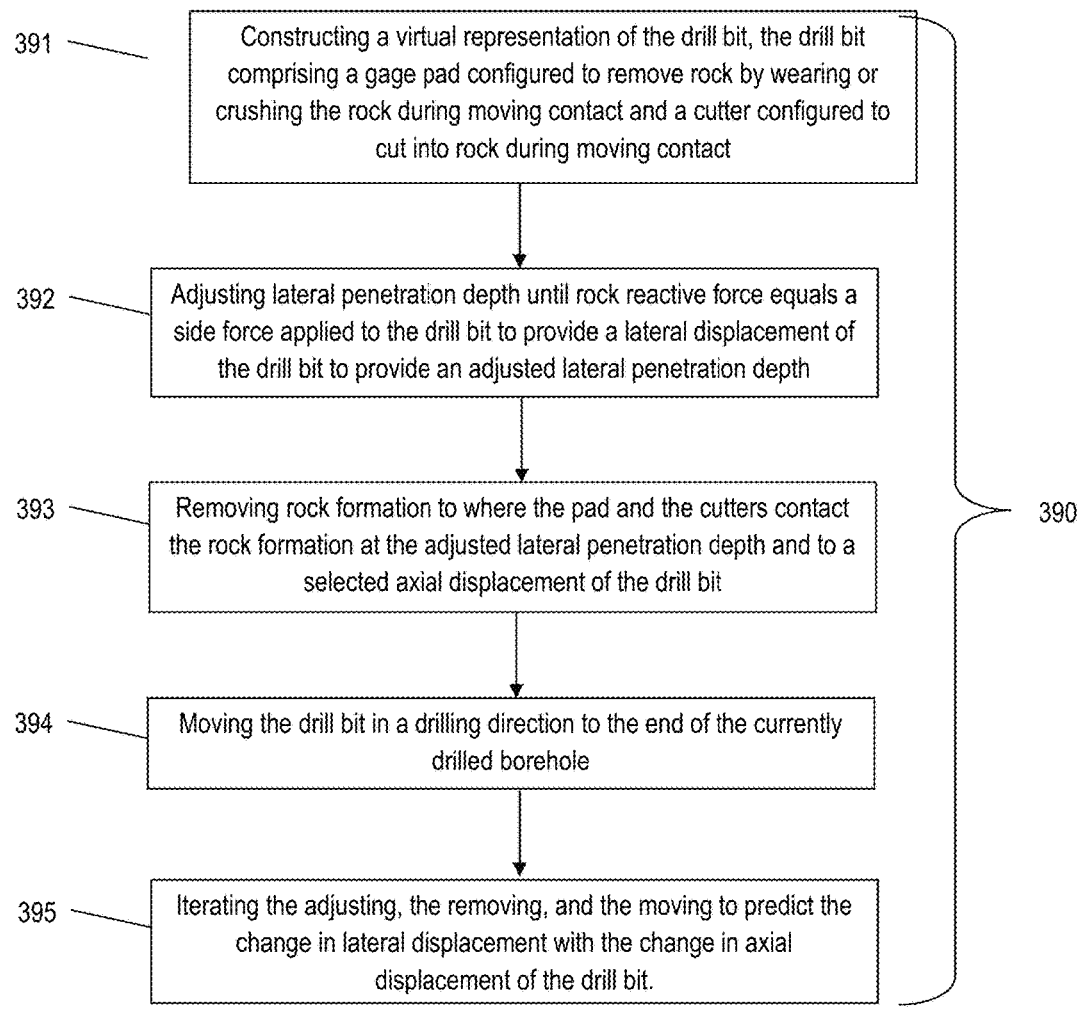
FIG. 39 is a flow chart for a method for predicting a change in lateral displacement with a change in axial displacement of a drill bit drilling in a rock formation.

FIG. 39 is a flow chart for a method 390 for predicting a change in lateral displacement with a change in axial displacement of a drill bit drilling in a formation rock. Block 391 calls for constructing a virtual representation of the drill bit and the formation rock, the drill bit comprising a gage pad configured to remove rock by wearing or crushing the rock during moving contact and a cutter configured to cut into rock during moving contact. Block 392 calls for adjusting lateral penetration depth until rock reactive force equals a side force applied to the drill bit to provide a lateral displacement of the drill bit to provide an adjusted lateral penetration depth. Block 393 calls for removing formation rock to where the pad and the cutters contact the formation rock at the adjusted lateral penetration depth and to a selected axial displacement of the drill bit. Block 394 calls for moving the drill bit in a drilling direction to the end of the currently drilled borehole. Block 395 calls for iterating the adjusting, the removing, and the moving to predict the change in lateral displacement with the change in axial displacement of the drill bit. The method 390 may also include using a first set of nodes as representation of the drill bit and a second set of nodes as a representation of the rock formation. The method 390 may further include setting the selected axial displacement as the axial distance between two nodes in the axial direction. The method 390 may further include initializing the nodes such that the nodes at the boundary of the drill bit with the rock formation overlap.

In support of the teachings herein, various analysis components may be used, including a digital and/or an analog system. For example, the steering device 9, the downhole sensor 10, the controller 11, or the computer processing system 12 may include digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of non-transitory computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure. Processed data such as a result of an implemented method may be transmitted as a signal via a processor output interface to a signal receiving device. The signal receiving device may be a display monitor or printer for presenting the result to a user. Alternatively or in addition, the signal receiving device may be memory or a storage medium. It can be appreciated that storing the result in memory or the storage medium will transform the memory or storage medium into a new state (containing the result) from a prior state (not containing the result). Further, an alert signal may be transmitted from the processor to a user interface if the result exceeds a threshold value.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The terms "first," "second" and the like do not denote a particular order, but are used to distinguish different elements.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for drilling a borehole in a rock formation according to a predicted path by a bottomhole assembly (BHA) comprising a drill bit coupled to a drill tubular, the BHA being operated by a drill rig, the method comprising:
    constructing a BHA model of the BHA, the BHA model comprising (a) dimensions, geometry, mass distribution, material density, and material stiffness of the BHA and (b) dimensions and geometry of the borehole as predicted to be drilled, the BHA model being configured to calculate (c) one or more points of contact between the BHA and a wall of the borehole and (d) forces imposed on the BHA at the one or more contact points, the forces comprising a side force vector imposed on the drill bit, and (e) drill bit tilt;
    calculating confined pressure by entering one of (i) borehole depth and mud weight and (ii) borehole depth, mud weight, and pore pressure into a first function based on porosity and/or permeability;
    calculating confined compressive strength by entering the calculated confined pressure, unconfined compressive strength, and internal angle of friction of the rock formation into a second function;
    calculating axial motion of the drill bit using lithology information, drilling parameters, drill bit design information, an effective back rake of one or more cutters, the confined compressive strength, and a force applied to each of the one or more cutters, the force being based on the calculated confined compressive strength, the area of cut, the effective back rake, and an orientation of each of the one or more cutters with respect to a surface of rock to be cut, wherein the effective back rake comprises an angle between a normal to a local cutting surface and a local rock surface;
    calculating lateral motion of the drill bit using a lateral motion drill bit model that receives (i) the calculated confined compressive strength, (ii) the lithology information, (iii) the drill bit design information, and (iv) the drill bit side force vector and drill bit tilt from the BHA model;
    calculating a ratio of the lateral motion to the axial motion;
    calculating an inclination angle and an azimuthal direction of the BHA using a BHA steering model that receives the ratio;
    iterating the constructing, calculating confined pressure, calculating confined compressive strength, calculating axial motion, calculating lateral motion, calculating a ratio, and calculating an inclination angle and an azimuthal direction to provide an updated BHA model that includes extending the borehole an incremental distance in the direction of the inclination angle and the azimuthal direction and displacing the BHA the incremental distance in the extended borehole to provide the predicted path; wherein the constructing, calculating confined pressure, calculating confined compressive strength, calculating axial motion, calculating lateral motion, calculating a ratio, and calculating an inclination angle and an azimuthal direction are implemented by a processor; and
    drilling the borehole with the drill rig in accordance with the predicted path based on the drilling parameters.

2. The method according to claim 1, wherein a weight-on-bit is specified by a user and the axial motion drill bit model is configured to calculate a rate-of-penetration of the BHA.

3. The method according to claim 1, wherein a rate-of-penetration (ROP) is specified by a user and the axial motion drill bit model is configured to calculate a weight-on-bit that provides the ROP.

4. The method according to claim 1, wherein the iterating is terminated when a desired location in the formation is reached by the borehole.

5. The method according to claim 1, further comprising determining the drilling parameters that result in the borehole reaching a desired location.

6. The method according to claim 1, wherein the drilling parameters comprise at least one selection from a group consisting of weight-on-bit, torque applied to the drill tubular, rotary speed of the drill tubular, rate-of-penetration, and drilling fluid flowrate.

7. The method according to claim 1, wherein lateral motion comprises lateral displacement and axial motion comprises axial displacement.

8. The method according to claim 1, wherein lateral motion comprises lateral rate-of-penetration (ROP) and axial motion comprises axial ROP.

9. The method according to claim 1, wherein the lithology information is received from a lithology log.

10. The method according to claim 1, further comprising updating the borehole dimensions and geometry in the BHA model using borehole caliper information received from a sensor configured to measure borehole diameter.

11. The method according to claim 1, further comprising updating the lithology information using data sensed by a downhole sensor disposed on a BHA as a borehole is being drilled.

12. The method according to claim 1, further comprising presenting the predicted path to a user using a display.

13. A non-transitory computer-readable medium comprising computer-executable instructions for drilling a borehole in an earth formation according to a predicted path by a bottomhole assembly (BHA) comprising a drill bit coupled to a drill tubular, the BHA being operated by a drill rig, that when executed by a processor cause an apparatus to implement a method comprising:
    constructing a BHA model of the BHA, the BHA model comprising (a) dimensions, geometry, mass distribution, material density, and material stiffness of the BHA and (b) dimensions and geometry of the borehole as predicted to be drilled, the BHA model being configured to calculate (c) one or more points of contact between the BHA and a wall of the borehole and (d) forces imposed on the BHA at the one or more contact points, the forces comprising a side force vector imposed on the drill bit, and (e) drill bit tilt;

calculating confined pressure using by entering one of (i) borehole depth and mud weight and (ii) borehole depth, mud weight, and pore pressure into a first function based on porosity and/or permeability;

calculating confined compressive strength by entering the calculated confined pressure, unconfined compressive strength, and internal angle of friction of the rock formation into a second function;

calculating axial motion of the drill bit using lithology information, drilling parameters, drill bit design information, an effective back rake of the one or more cutters, the confined compressive strength, and a force applied to each of one or more cutters, the force being based on the calculated confined compressive strength, the area of cut, the effective back rake, and an orientation of each of the one or more cutters with respect to a surface of rock to be cut, wherein the effective back rake comprises an angle between a normal to a local cutting surface and a local rock surface;

calculating lateral motion of the drill bit using a lateral motion drill bit model that receives (i) the calculated confined compressive strength, (ii) the lithology information, (iii) the drill bit design information, and (iv) the drill bit side force vector and drill bit tilt from the BHA model;

calculating a ratio of lateral motion to axial motion;

calculating an inclination angle and an azimuthal direction of the BHA using a BHA steering model that receives the ratio; and iterating the constructing, calculating confined pressure, calculating confined compressive strength, calculating axial motion, calculating lateral motion, calculating a ratio, and calculating an inclination angle and an azimuthal direction to provide an updated BHA model that includes extending the borehole an incremental distance in the direction of the inclination angle and the azimuthal direction and displacing the BHA the incremental distance in the extended borehole to provide the predicted path;

drilling the borehole with the drill rig in accordance with the predicted path based on the drilling parameters.

14. A method for drilling a borehole in a rock formation according to a predicted path by a bottomhole assembly (BHA) comprising a drill bit coupled to a drill tubular, the BHA being operated by a drill rig, the method comprising:

constructing a BHA model of the BHA, the BHA model comprising (a) dimensions, geometry, mass distribution, material density, and material stiffness of the BHA and (b) dimensions and geometry of the borehole as predicted to be drilled, the BHA model being configured to calculate (c) one or more points of contact between the BHA and a wall of the borehole and (d) forces imposed on the BHA at the one or more contact points, the forces comprising a side force vector imposed on the drill bit, and (e) drill bit tilt;

calculating confined pressure using borehole depth, mud weight, pore pressure, porosity, and permeability;

calculating confined compressive strength using the calculated confined pressure, unconfined compressive strength, and internal angle of friction of the rock formation;

calculating axial motion of the drill bit using lithology information, drilling parameters, drill bit design information, an effective back rake of one or more cutters, the confined compressive strength, and a force applied to each of the one or more cutters, the force being based on the calculated confined compressive strength, the area of cut, the effective back rake, and an orientation of each of the one or more cutters with respect to a surface of rock to be cut;

calculating lateral motion of the drill bit using a lateral motion drill bit model that receives (i) the calculated confined compressive strength, (ii) the lithology information, (iii) the drill bit design information, and (iv) the drill bit side force vector and drill bit tilt from the BHA model;

calculating a ratio of the lateral motion to the axial motion;

calculating an inclination angle and an azimuthal direction of the BHA using a BHA steering model that receives the ratio;

iterating the constructing a BHA model, calculating confined pressure, calculating confined compressive strength, calculating axial motion, calculating lateral motion, calculating a ratio, and calculating an inclination angle and an azimuthal direction to provide an updated BHA model that includes extending the borehole an incremental distance in the direction of the inclination angle and the azimuthal direction and displacing the BHA the incremental distance in the extended borehole to provide the predicted path; wherein the constructing, calculating confined pressure, calculating confined compressive strength, calculating axial motion, calculating lateral motion, calculating a ratio, and calculating an inclination angle and an azimuthal direction are implemented by a processor; and drilling the borehole with the drill rig in accordance with the predicted path based on the drilling parameters;

wherein calculating confined compressive strength comprises using the following equation:

$$CCS = UCS + \frac{1 + \text{SIN}(FA)}{1 - \text{SIN}(FA)} CP$$

where CCS is confined compressive strength; UCS is unconfined compressive strength; FA is internal angle of friction; and CP is confining pressure.

15. A non-transitory computer-readable medium comprising computer-executable instructions for drilling a borehole in an earth formation according to a predicted path by a bottomhole assembly (BHA) comprising a drill bit coupled to a drill tubular, the BHA being operated by a drill rig, that when executed by a processor cause an apparatus to implement a method comprising:

constructing a BHA model of the BHA, the BHA model comprising (a) dimensions, geometry, mass distribution, material density, and material stiffness of the BHA and (b) dimensions and geometry of the borehole as predicted to be drilled, the BHA model being configured to calculate (c) one or more points of contact between the BHA and a wall of the borehole and (d) forces imposed on the BHA at the one or more contact points, the forces comprising a side force vector imposed on the drill bit, and (e) drill bit tilt;

calculating confined pressure using borehole depth, mud weight, pore pressure, porosity, and permeability;

calculating confined compressive strength using the calculated confined pressure, unconfined compressive strength, and internal angle of friction of the rock formation;

calculating axial motion of the drill bit using lithology information, drilling parameters, drill bit design information, an effective back rake of the one or more cutters, the confined compressive strength, and a force applied to each of one or more cutters, the force being based on the calculated confined compressive strength, the area of cut, the effective back rake, and an orientation of each of the one or more cutters with respect to a surface of rock to be cut;

calculating lateral motion of the drill bit using a lateral motion drill bit model that receives (i) the calculated confined compressive strength, (ii) the lithology information, (iii) the drill bit design information, and (iv) the drill bit side force vector and drill bit tilt from the BHA model;

calculating a ratio of lateral motion to axial motion;

calculating an inclination angle and an azimuthal direction of the BHA using a BHA steering model that receives the ratio;

iterating the constructing a BHA model, calculating confined pressure, calculating confined compressive strength, calculating axial motion, calculating lateral motion, calculating a ratio, and calculating an inclination angle and an azimuthal direction to provide an updated BHA model that includes extending the borehole an incremental distance in the direction of the inclination angle and the azimuthal direction and displacing the BHA the incremental distance in the extended borehole to provide the predicted path;

drilling the borehole with the drill rig in accordance with the predicted path based on the drilling parameters;

wherein calculating confined compressive strength comprises using the following equation:

$$CCS = UCS + \frac{1 + \text{SIN}(FA)}{1 - \text{SIN}(FA)} CP$$

where CCS is confined compressive strength; UCS is unconfined compressive strength; FA is internal angle of friction; and CP is confining pressure.

16. The method according to claim 1, wherein the one or more cutters comprises a chamfer and the chamfer comprises the local cutting surface.

17. The non-transitory computer-readable medium according to claim 13, wherein the one or more cutters comprises a chamfer and the chamfer comprises the local cutting surface.

* * * * *